(12) United States Patent
Sakane et al.

(10) Patent No.: US 7,524,437 B2
(45) Date of Patent: *Apr. 28, 2009

(54) PHOSPHOR AND MANUFACTURING METHOD OF THE SAME, AND LIGHT EMITTING DEVICE USING THE PHOSPHOR

(75) Inventors: Kenji Sakane, Tokyo (JP); Akira Nagatomi, Tokyo (JP)

(73) Assignee: Dowa Electronics Materials Co., Ltd., Tokyo (JP)

(*) Notice: Subject to any disclaimer, the term of this patent is extended or adjusted under 35 U.S.C. 154(b) by 311 days.

This patent is subject to a terminal disclaimer.

(21) Appl. No.: 11/365,830

(22) Filed: Mar. 2, 2006

(65) Prior Publication Data

US 2006/0197439 A1    Sep. 7, 2006

Related U.S. Application Data

(60) Provisional application No. 60/658,198, filed on Mar. 4, 2005.

(51) Int. Cl.
C09K 11/08    (2006.01)
C09K 11/55    (2006.01)
C09K 11/59    (2006.01)
C09K 11/64    (2006.01)

(52) U.S. Cl. .................. 252/301.4 F; 252/301.6 F; 313/503; 257/98

(58) Field of Classification Search ........... 252/301.4 F, 252/301.6 F; 313/503; 257/98
See application file for complete search history.

(56) References Cited

U.S. PATENT DOCUMENTS 18,985 A    12/1857    Olds 2,121,275 A    6/1938    Zober et al.
3,527,595 A    9/1970    Adler et al.

(Continued)

FOREIGN PATENT DOCUMENTS

EP    0 459 156 A2    4/1991

(Continued)

OTHER PUBLICATIONS

K. Uheda et al., "The Crystal Structure and Photoluminescence Properties of a New Red Phosphor, Calcuim Aluminum Silicon Nitride Doped With Divalent Euroium," Abs. 2073, 206th Meeting., Oct. 3, 2004.

(Continued)

*Primary Examiner*—C. Melissa Koslow
(74) *Attorney, Agent, or Firm*—Oliff & Berridge, PLC

(57) ABSTRACT

To provide a phosphor having an emission spectrum with a broad peak in a range from green color to yellow color, having a broad and flat excitation band capable of using lights of broad range from near ultraviolet/ultraviolet to blue lights as excitation lights, and having excellent emission efficiency and luminance. The problem is solved by providing the phosphor expressed by a general composition formula $M_mA_aB_bO_oN_n:Z$ (where element M is one or more kinds of elements having bivalent valency, element A is one or more kinds of elements having tervalent valency, element B is one or more kinds of elements having tetravalent valency, O is oxygen, N is nitrogen, and element Z is one or more kinds of elements acting as the activator.), satisfying $4.0 < (a+b)/m < 7.0$, $a/m \geq 0.5$, $b/a > 2.5$, $n > o$, $n = 2/3\, m + a + 4/3\, b - 2/3\, o$.

31 Claims, 15 Drawing Sheets

U.S. PATENT DOCUMENTS

| | | |
|---|---|---|
| 3,697,301 A | 10/1972 | Donofrio et al. |
| 4,477,689 A | 10/1984 | Ogasahara et al. |
| 4,576,736 A | 3/1986 | Harmuth |
| 5,398,398 A | 3/1995 | Williams et al. |
| 5,447,291 A | 9/1995 | Sandhage |
| 5,600,202 A | 2/1997 | Yamada et al. |
| 6,180,029 B1 | 1/2001 | Hampden-Smith et al. |
| 6,504,297 B1 | 1/2003 | Heo et al. |
| 6,670,748 B2 | 12/2003 | Ellens et al. |
| 7,138,756 B2 | 11/2006 | Gotoh et al. |
| 2002/0043926 A1 | 4/2002 | Takahashi et al. |
| 2003/0030038 A1 | 2/2003 | Mitomo et al. |
| 2003/0094893 A1 | 5/2003 | Ellens et al. |
| 2003/0132422 A1 | 7/2003 | Tian et al. |
| 2003/0152804 A1 | 8/2003 | Miura et al. |
| 2003/0213611 A1 | 11/2003 | Morita |
| 2004/0155225 A1 | 8/2004 | Yamada et al. |
| 2004/0263074 A1 | 12/2004 | Baroky et al. |
| 2005/0001225 A1 | 1/2005 | Yoshimura et al. |
| 2005/0189863 A1 | 9/2005 | Nagatomi et al. |
| 2005/0205845 A1 | 9/2005 | Delsing et al. |
| 2005/0253500 A1 | 11/2005 | Gotoh et al. |
| 2005/0267243 A1 | 12/2005 | Amasaki et al. |
| 2006/0006782 A1 | 1/2006 | Nagatomi et al. |
| 2006/0017365 A1 | 1/2006 | Nagatomi et al. |
| 2006/0021788 A1 | 2/2006 | Kohayashi et al. |
| 2006/0022573 A1 | 2/2006 | Gotoh et al. |
| 2006/0033083 A1 | 2/2006 | Sakane et al. |
| 2006/0043337 A1 | 3/2006 | Sakane et al. |
| 2006/0045832 A1* | 3/2006 | Nagatomi et al. ........... 423/325 |
| 2006/0065878 A1 | 3/2006 | Sakane et al. |
| 2006/0076883 A1 | 4/2006 | Himaki et al. |
| 2006/0091790 A1* | 5/2006 | Nagatomi et al. ........... 313/503 |
| 2006/0170332 A1 | 8/2006 | Tamaki et al. |
| 2006/0197432 A1 | 9/2006 | Nagatomi et al. |
| 2006/0197439 A1 | 9/2006 | Sakane et al. |
| 2006/0220047 A1 | 10/2006 | Nagatomi et al. |
| 2006/0220520 A1 | 10/2006 | Sakane et al. |
| 2006/0244356 A1* | 11/2006 | Nagatomi et al. ........... 313/485 |
| 2007/0007494 A1 | 1/2007 | Hirosaki et al. |
| 2007/0029525 A1 | 2/2007 | Gotoh et al. |
| 2007/0164308 A1 | 7/2007 | Yoshimura et al. |

FOREIGN PATENT DOCUMENTS

| | | |
|---|---|---|
| EP | 1 296 376 A1 | 3/2003 |
| EP | 1 445 295 A1 | 8/2004 |
| JP | A 05-015655 | 1/1993 |
| JP | A 05-198433 | 8/1993 |
| JP | A 11-144938 | 5/1999 |
| JP | A 11-277527 | 10/1999 |
| JP | A 2000-073053 | 3/2000 |
| JP | A 2000-153167 | 6/2000 |
| JP | A 2001-214162 | 8/2001 |
| JP | A 2002-322474 | 11/2002 |
| JP | A 2002-363554 | 12/2002 |
| JP | A 2003-013059 | 1/2003 |
| JP | A 2003-096446 | 4/2003 |
| JP | A 2003-124527 | 4/2003 |
| JP | A 2003-515655 | 5/2003 |
| JP | A 2003-203504 | 7/2003 |
| JP | A 2003-206481 | 7/2003 |
| JP | A 2003-277746 | 10/2003 |
| JP | A 2003-336059 | 11/2003 |
| JP | A 2004-055536 | 2/2004 |
| JP | A 2004-055910 | 2/2004 |
| JP | A 2004-505470 | 2/2004 |
| JP | A 2004-067837 | 3/2004 |
| JP | A 2004-145718 | 5/2004 |
| JP | 2004-235598 * | 6/2004 |
| JP | A-2004-186278 | 7/2004 |
| JP | A 2004-189997 | 7/2004 |
| JP | A 2004-244560 | 9/2004 |
| JP | 2005-344025 | 12/2005 |
| JP | 2006-028295 | 2/2006 |
| JP | 2006-063214 | 3/2006 |
| JP | 2006-063286 | 3/2006 |
| JP | 2006-070109 | 3/2006 |
| JP | 2006-176546 | 7/2006 |
| JP | A-2006-282809 | 10/2006 |
| JP | A-2006-282872 | 10/2006 |
| WO | WO 01/40403 A1 | 6/2001 |
| WO | WO 02/11214 A1 | 2/2002 |
| WO | WO 2004/029177 A1 | 4/2004 |
| WO | WO 2004/030109 A1 | 4/2004 |
| WO | WO 2004/039915 A1 | 5/2004 |
| WO | WO 2004/055910 A1 | 7/2004 |
| WO | WO 2005/052087 A1 | 6/2005 |
| WO | WO 2006/093298 A1 | 9/2006 |

OTHER PUBLICATIONS

JIS Z 8726; "Method of Specifying Colour Rendering Properties of Light Sources"; (1990), pp. 381-390.
"Phosphor Handbook"; (compiled by Phosphor Research Society, published by Ohmusha, Ltd., 1987); pp. 172-176.
U.S. Appl. No. 11/149,317, filed Jun. 10, 2005; Nagatomi et al.
U.S. Appl. No. 11/149,192, filed Jun. 10, 2005; Sakane et al.
U.S. Appl. No. 11/198,281, filed Aug. 8, 2005; Nagatomi et al.
U.S. Appl. No. 11/194,590, filed Aug. 2, 2005; Gotoh et al.
U.S. Appl. No. 11/218,504, filed Sep. 6, 2005; Nagatomi et al.

* cited by examiner

US 7,524,437 B2

PHOSPHOR AND MANUFACTURING METHOD OF THE SAME, AND LIGHT EMITTING DEVICE USING THE PHOSPHOR

This nonprovisional application claims the benefit of U.S. Provisional Application Ser. No. 60/658,198, filed Mar. 4, 2005.

TECHNICAL FIELD OF THE INVENTION

The present invention relates to a phosphor used for a cathode-ray tube (CRT), a display such as a field emission display (FED) and a plasma display (PDP), and an illumination device such as a fluorescent lamp and a fluorescent display tube, and a phosphor containing nitrogen used for an illumination device such as a crystal liquid back light and a method of manufacturing therefore, and also to a light emitting device such as a white LED illumination in which a semiconductor light emitting element (LED) and the phosphor are combined.

BACKGROUND OF THE INVENTION

At present, a discharge type fluorescent lamp and an incandescent bulb used as the illumination device involve problems that a harmful substance such as mercury is contained, and life span is short. However, in recent years, a high luminescence LED emitting light of near ultraviolet/ultraviolet to blue color has been developed in sequence, and the white LED illumination for the practical application of the next generation has been actively studied and developed, in which the white light is prepared by mixing the light of the near ultraviolet/ultraviolet to blue color generated from the LED and the light generated from the phosphor having an excitation band in a wavelength region thereof. When the white LED illumination is put to practical use, since efficiency of converting electric energy into light is improved, less heat is generated and it is constituted of the LED and a phosphor, the white LED has advantages of good life span without burn-out of a filament like a conventional incandescent bulb and the harmful substance such as mercury is not contained, and miniaturization of the illumination device is realized, thus realizing an ideal illumination device.

At present, two systems of the white LED illumination are proposed. As one of them, a multi chip type system is given, in which three primary color LEDs such as red LED, blue LED, and green LED with high luminance are used. As the other of them, one chip system is given, in which LED with high luminance emitting in near ultraviolet/ultraviolet to blue color and the phosphor excited by the light having an emission spectrum with a peak in the range from ultraviolet to blue color generated by the LED are combined. When such two systems are compared from the viewpoint of illumination, particularly in the one chip system, by using the phosphor having a broad emission spectrum, the white emission spectrum is approximated the spectrum of the sun-light, and the color rendering properties are possibly improved. Further, the one chip system has a lot of advantages such that a drive circuit can be simplified and small-sized, a light guide for performing color mixture is unnecessary, and a difference in a drive voltage and light output of each LED and temperature characteristics need not to be considered, and cost can be reduced. This contributes to focusing on the one chip system as the illumination of next generation, compared with the multi chip type system. The white LED illumination, in which the high luminance blue LED and the phosphor emitting yellow color by being excited by the blue light generated from the LED are combined, is given as one of the examples of the one chip type while LED illumination. Specifically, for example, the high luminance blue LED and the yellow phosphor $(Y, Gd)_3, (Al, Ga)_5O_{12}$:Ce (YAG :Ce), $Tb_3Al_5O_{12}$:Ce, $Ca_3Si_3O_{12}$:Ce can be combined. In the white LED illumination, white color is obtained by using a complementary relation between the blue emission of the LED and yellow emission of the phosphor, thereby allowing fewer phosphors to be used. Further, the yellow phosphor YAG :Ce used for the white LED illumination has an excitation spectrum with a peak near the wavelength of 460 nm, thereby allowing emission with high efficiency, and has an emission spectrum with a luminance (visibility) peak at about 560 nm, thereby allowing high luminance white LED to be obtained. However, the problem of the white LED illumination is that the emission on the long-wavelength side of visible light range, specifically the emission of red color component is insufficient, and therefore, only slightly bluish white emission can be obtained, and a slightly reddish white emission like an electric bulb can not be obtained, thereby deteriorating in the color rendering properties. However, in recent years, the phosphor having an excitation spectrum with a peak in the wavelength range from yellow color to red color, and having an emission spectrum with a peak in a broad range, and also having a good excitation band in a range from near ultraviolet/ultraviolet to blue color has been developed in sequence. Then, by adding such a phosphor, the color rendering properties are improved.

Also, the white color LED illumination in which white color is obtained by using a mixed state of colors of the lights of the LED emitting the near ultraviolet/ultraviolet color, and the phosphor emitting red color (R), the phosphor emitting green color (G), and the phosphor emitting blue (B) color obtained by being excited by the near ultraviolet/ultraviolet light generated from the LED, is given as another example of the one chip type white LED illumination. A method of obtaining white emission by the lights of the R, G, B, and other colors is capable of obtaining an arbitrary emission color other than white light, depending on the combination and mixed ratio of the R, G, B, and is excellent in color rendering properties, because the white emission is obtained not by the complementary relation of the light but by the relation of mixed state of colors using the R,G,B.

Then, as the phosphor used for such an application, examples are given such as $Y_2O_2S$:Eu, $La_2O_2S$:Eu, $3.5MgO.0.5MgF_2.GeO_2$:Mn, $(La, Mn, Sm)_2O_2S.Ga_2O_3$:Eu for the red phosphor, ZnS:Cu, Al, $CaGa_2S_4$:Eu, $SrGa_2S_4$:Eu, $BaGa_2S_4$:Eu $SrAl_2O_4$:Eu, BAM:Eu, Mn, $Ba_2SiO_4$:Eu for the green phosphor, and BAM:Eu, $Sr_5(PO_4)_3Cl$:Eu, ZnS:Ag, $(Sr, Ca, Ba, Mg)_{10}(PO_4)_6Cl_2$:Eu for the blue phosphor. However, the red phosphor out of the phosphors of three colors has a sharp emission spectrum, while the phosphors of other colors have spectra with peaks in a broad range, thereby involving the problem that the color rendering properties of the white light obtained is unsatisfactory, and emission characteristic at a high temperature is deteriorated. However, such a problem has also been solved, as described above, by developing in sequence the phosphors containing nitrogen, excellent in temperature characteristic and excitation band characteristic, and emitting from yellow color to red color.

The problem involved in the phosphor emitting yellow color to red color is substantially solved, by developing the phosphor having the emission spectrum with a peak in the wavelength range from yellow color to red color, having a broad emission spectrum, and further having a good excitation band in the wavelength range from the near ultraviolet/ultraviolet to blue color. As the phosphor containing nitrogen as described above, $Ca_2Si_5N_8$:Eu, $Sr_2Si_5N_8$:Eu, $Ba_2Si_5N_8$:

Eu, $Ca_x(Al,Si)_{12}(O,N)_{16}$:Eu(0<x≦1.5), $CaAl_2Si_4N_8$:Eu, $CaSiN_2$:Eu $CaAlSiN_3$:Eu and so forth are typically given as examples.

By developing a new phosphor as described above emitting from yellow color to red color, the problem is involved in sequence in the phosphor having the emission spectrum with a peak in the wavelength range from green color to yellow color.

First, the problem involved in the yellow phosphor YAG:Ce is explained by using FIG. 15. FIG. 15 is a view showing an excitation spectrum obtained by measuring an intensity of the light with the wavelength of 559.2 nm emitting light when the YAG:Ce is excited by an excitation light with the wavelength of 300 to 570 nm.

In the white LED illumination obtained by combining the high luminance blue LED and the YAG:Ce phosphor emitting yellow color by being excited by blue color generated from the LED, the YAG:Ce phosphor has a high efficient excitation band for the light with the wavelength of 460 nm generated from the blue LED, and further, has an emission spectrum with a luminance (visibility) peak at closest to the wavelength of 560 nm or around, thereby allowing a high luminance white LED Illumination to be obtained. However, as clarified from FIG. 15, the YAG:Ce phosphor has an emission characteristic of emitting the light with the wavelength of 560 nm or around with high efficiency, when excited by the light with the wavelength of 460 nm. However, the emission wavelength of the blue LED is changed due to variation in manufacturing the blue LED when excited by the blue light of the blue LED. Then if the emission wavelength is deviated from the range of an optimal excitation band of the YAG:Ce, disruption of balance between the blue color and yellow color emission intensity occurs because of the narrow excitation band of YAG:Ce. Such a situation involves the problem that color tone of the white light obtained by synthesizing the blue light and the yellow light is changed.

Further, the YAG:Ce phosphor has an excellent emission spectrum in the wavelength range from about 500 to 550 nm of green color component of visible light. Therefore, preferably the YAG:Ce phosphor is used as a green phosphor of the white LED illumination in which the near ultravilet/ultraviolet LED, the red (R) color emitting phosphor, the green (G) color emitting phosphor, and the blue color (B) emitting phosphor are combined. However, when emitted by the near ultraviolet/ultraviolet light, as shown in FIG. 15, the YAG:Ce phosphor has a low efficient excitation band in the emission wavelength of 380 to 410 nm or around of the near ultraviolet/ultraviolet LED. Therefore, the problem involved therein is that a sufficient emission can not be obtained, and the high luminance white LED illumination can not be obtained.

Next, the problem involved in the green phosphor used in the ultraviolet emission will be explained. As the white LED illumination using the light in a mixed state of the near ultraviolet/ultraviolet emitting LED and the red (R) color emitting phosphor, the green (G) color emitting phosphor, and the blue (B) color emitting phosphor obtained by being excited by the light of the near ultraviolet/ultraviolet light generated from the LED, at present, the green phosphor such as ZnS:Cu, Al, $SrAl_2O_4$:Eu, BAM:Eu, Mn, $Ba_2SiO_4$:Eu are used. Out of such phosphors, the problem is that a sulfide phosphor is significantly deteriorated in emission intensity, when heat is applied thereon, and further has no water-resisting property. In addition, an oxide phosphor does not have a good efficient excitation band in a broad range of the wavelength in the vicinity of the near ultraviolet/ultraviolet. Therefore, the problem involved therein is that when the variation in emission wavelength occurs due to by variation in manufacturing the near ultraviolet/ultraviolet LED, the emission wavelength of the near ultraviolet/ultraviolet LED is deviated from the optimal excitation range, thereby disrupting the balance in emission intensity among the red color, green color, and blue color, resulting in the change of the color tone of the white light.

Therefore, as the green to yellow emitting phosphor by being excited by the light of the near ultraviolet/ultraviolet to blue color also, demand on the new phosphor having a flat high efficient excitation band in the wavelength range from the near ultraviolet/ultraviolet to blue color, and having a broad emission spectrum, and further having an excellent durability against heat and water, and replacing the YAG:Ce phosphor and the ZnS:Cu, Al phosphor is increased. In order to respond to such a demand, the green to yellow emitting phosphor is actively pursued, and in recent years, silicon nitride-based phosphor (for example see patent document 1), and oxynitride phosphor (for example, see patent documents 5 and 6) are proposed as the green to yellow emitting phosphor. (Patent document 1) Japanese Patent Laid Open No.2002-322474 (Patent document 2) Japanese Patent Laid Open No.2003-203504 (Patent document 3) Japanese Patent Laid Open No.2003-206481 (Patent document 4) Japanese Patent Laid Open No.2002-363554 (Patent document 5) WO Publication No.2004/029177 A1 pamphlet (Patent document 6) WO Publication No.2004/055910 A1 pamphlet

DISCLOSURE OF THE INVENTION

Problem to be Solved

However, although such a phosphor containing nitrogen has an excellent durability against heat and water, has a flat excitation band in the wavelength range from the near ultraviolet/ultraviolet to blue color, and has an emission spectrum with a broad peak, the emission efficiency does not meet a satisfactory level when excited by the excitation light of the near ultraviolet/ultraviolet to blue color, and a sufficient emission intensity and luminance are not obtained. Therefore, although the white LED illumination having an excellent durability can be manufactured, the emission intensity and luminance are insufficient. Therefore, when the one chip type white LED illumination is manufactured by combining the near ultraviolet/ultraviolet LED and the blue LED or the like and the aforementioned phosphor containing nitrogen, the luminance which is a most important factor as the illumination becomes insufficient.

In view of the aforementioned problems, the present invention is provided, and an object of the present invention is to provide a phosphor having an emission spectrum with a peak in a broad range from green color to yellow color, having a flat excitation band in the range from near ultraviolet/ultraviolet to blue color, and having an excellent emission efficiency and luminance, manufacturing method thereof, and an emission device such as a white LED illumination using such a phosphor.

Means to be Solved

In order to solve the aforementioned problems, study on various phosphor compositions containing nitrogen is pursued. Then, as a result, it is found that a new phosphor having a broad flat excitation band in the range from near ultraviolet/ultraviolet to blue color, having an improved emission intensity and luminance in the range from green color to yellow color, and having an emission spectrum with a peak in a broad range can be obtained by adjusting the phosphor with a matrix composition having a site where even Ce with large ion radius can be easily and stably replaceable. Further, it is found that the phosphor having excellent emission intensity and luminance in the range from yellow color to red color is obtained, when Eu or the like is used as an activator.

In order to solve the aforementioned problems, the present invention takes several aspects as follows.

In a first aspect, a phosphor is provided, which is given as a general composition formula expressed by MmAaBbOoNn:Z, (where element M is one or more kinds of elements having bivalent valency, element A is one or more kinds of elements having tervalent valency, element B is one or more kinds of elements having tetravalent valency, O is oxygen, N is nitrogen, and element Z is the element acting as the activator.), satisfying $4.0<(a+b)/m<7.0$, $a/m\geq0.5$, $b/a>2.5$, $n>o$, $n=2/3\ m+a+4/3\ b-2/3\ o$.

In a second aspect, the phosphor according to the first aspect is provided, satisfying $0.5\leq a/m\leq1.5$, $3.5<b/m<6.5$, $0<o/m<4.0$.

In a third aspect, the phosphor according to either of the first aspect or the second aspect is provided, satisfying by $0.8\leq a/m\leq1.2$, $4.0\leq b/m\leq6.0$, $0<o/m\leq3.0$.

In a fourth aspect, the phosphor according to any one of the first to third aspects is provided, wherein the element M is one or more kind of element selected from the group consisting of Mg, Ca, Sr, Ba, Zn, and rare earth elements having bivalent valency, the element A is one or more kind of element selected from the group consisting of Al, Ga, In, Tl, Y, Sc, P, As, Sb, and Bi, the element B is one or more kind of element selected from the group consisting of Si, Ge, Sn, Ti, Hf, Mo, W, Cr, Pb, Zr, and the element Z is one or more kind of element selected from the group consisting of the rare earth element and transition metal elements.

In a fifth aspect, the phosphor according to any one of the first to fourth aspects is provided, wherein the element M is one or more kind of element selected from the group consisting of Mg, Ca, Sr, Ba, Zn, the element A is one or more kind of element selected from the group consisting of Al, Ga, In, the element B is Si and/or Ge, and the element Z is one or more kind of element selected from the group consisting of Eu, Ce, Pr, Tb, and Mn.

In a sixth aspect, the phosphor according to any one of the first to fifth aspects is provided, wherein the element M is Sr, the element A is Al, the element B is Si, and the element Z is Eu and/or Ce.

In a seventh aspect, the phosphor according to any one of the first to sixth aspects is provided, wherein when the general formula is expressed by MmAaBbOoNn:Zz, the value of $z/(m+z)$, which is a molar ratio of the element M to the element Z, is not less than 0.0001 and not more than 0.5.

In an eight aspect, the phosphor according to any one of the first to seventh aspects is provided, which is given as formulas expressed by: $Sr_6Al_6Si_{18}O_3N_{32}$:Ce, $SrAlSi_3ON_5$:Ce, $Sr_3Al_3Si_9O_6N_{13}$:Ce, $Sr_6Al_6Si_{24}O_3N_{40}$:Ce, $Sr_3Al_3Si_{12}O_3N_{19}$:Ce, $Sr_3Al_3Si_{12}O_6N_{17}$:Ce, $Sr_6Al_6Si_{27}O_3N_{44}$:Ce, $Sr_2Al_2Si_9O_2N_{14}$:Ce, $Sr_6Al_6Si_{27}O_{12}N_{38}$:Ce, $Sr_2Al_2Si_{10}ON_{16}$:Ce, $Sr_3Al_3Si_{15}O_3N_{23}$:Ce, $SrAlSi_5O_2N_7$:Ce, $Sr_6Al_6Si_{36}O_3N_{56}$:Ce, $SrAlSi_6ON_9$:Ce, $Sr_3Al_3Si_{18}O_6N_{25}$:Ce, $Sr_6Al_6Si_{18}O_3N_{32}$:Eu, $SrAlSi_3ON_5$:Eu, $Sr_3Al_3Si_9O_6N_{13}$:Eu, $Sr_6Al_6Si_{24}O_3N_{40}$:Eu, $Sr_3Al_3Si_{12}O_3N_{19}$:Eu, $Sr_3Al_3Si_{12}O_6N_{17}$:Eu, $Sr_6Al_6Si_{27}O_3N_{44}$:Eu, $Sr_2Al_2Si_9O_2N_{14}$:Eu, $sr_6Al_6Si_{27}O_{12}N_{38}$:Eu, $Sr_2Al_2Si_{10}ON_{16}$:Eu, $Sr_3Al_3si_{15}O_3N_{23}$:Eu, $SrAlSi_5O_2N_7$:Eu, $Sr_6Al_6Si_{36}O_3N_{56}$:Eu, $SrAlSi_6ON_9$:Eu, $Sr_3Al_3Si_{18}O_6N_{25}$:Eu.

In a ninth aspect, the phosphor according to any one of the first to eighth aspects is provided, containing Sr of 20.0 to 27.0 wt %, Al of 5.0 to 9.0 wt %, Si of 30.0 to 39.0 wt %, O of 0.5 to 6.0 wt %, N of 26.0 to 32.0 wt %, and Ce of beyond 0 to 3.5 wt %, wherein when the phosphor is irradiated with one or more kind of monochromatic light or continuous light having the wavelength range from 350 nm to 500 nm as an excitation light, a peak wavelength in the emission spectrum is in the range from 500 to 600 nm, and x of chromaticity (x,y) of the emission spectrum is in the range from 0.3500 to 0.4500, and y of the chromaticity (x,y) is in the range from 0.5000 to 0.6000.

In a tenth aspect, the phosphor according to any one of the first to eighth aspects is provided, containing Sr of 20.0 to 27.0 wt %, Al of 5.0 to 9.0 wt %, Si of 30.0 to 39.0 wt %, O of 0.5 to 6.0 wt %, N of 26.0 to 32.0 wt %, and Eu of beyond 0 to 3.5 wt %, wherein when the phosphor is irradiated with one or more kind of monochromatic light or continuous light having the wavelength range from 350 nm to 550 nm as an excitation light, the peak wavelength of the emission spectrum is in the range from 550 to 650 nm, and x of the chromaticity of the emission spectrum (x,y) is in the range from 0.4500 to 0.6000, and y of the chromaticity of the emission spectrum (x,y) is in the range from 0.3500 to 0.5000.

In an eleventh aspect, the phosphor according to the tenth aspect is provided, wherein when the phosphor is irradiated with the monochromatic light having the wavelength range from 350 nm to 550 nm as an excitation light, the relation of $P_H$ and $P_L$ is given satisfying $(P_H-P_L)/P_H\leq0.20$, when a peak intensity of a maximum peak in a spectrum of light emission that occurs by absorbing the excitation light that makes it highest is defined as $P_H$, and the peak intensity of the maximum peak in the spectrum of light emission that occurs by absorbing the excitation light that makes it smallest is defined as $P_L$.

In a twelfth aspect, the phosphor according to any one of the first to eleventh aspect is provided, wherein in an X-ray powder diffraction pattern by CoKα ray, when the maximum peak is defined as a, b, and c, respectively, with Bragg angle (2Θ) in a range from 28.5° to 29.5°, 35.5° to 36.5°, and 41.0° to 42.0°, and a peak intensity ratio of a to b is defined as I(a/b), and the peak intensity ratio of c to b is defined as I(c/b), the relation of a, b, c is given satisfying $0.20<I(a/b)$, $I(c/b)<0.80$.

In a thirteenth aspect, the phosphor according to any one of the first to twelfth aspects is provided, wherein when the value of relative intensity of the maximum peak in the emission spectrum is defined as $P_{25}$ when the phosphor is irradiated with a specified monochromatic light in the wavelength range from 350 nm to 550 nm as the excitation light at 25° C., and the value of the relative intensity of the maximum peak is defined as $P_{200}$ when the phosphor is irradiated with the specified monochromatic light as the excitation light at 200° C., the relation of $P_{25}$ and $P_{200}$ is given satisfying $P_{25}-P_{200})/P_{25}\times100<35$.

In a fourteenth aspect, the phosphor according to any one of the first to thirteenth aspect is provided, wherein the phosphor is a powdery form.

In a fifteenth aspect, the phosphor according to the fourteenth aspect is provided, containing a primary particle with particle size of 20 μm or less and aggregates in which the primary particle agglutinates, wherein an average particle size (D50) of the powdery phosphor containing the primary particle and the aggregates is 1.0 μm or more and 20.0 μm or less.

In a sixteenth aspect, a method of manufacturing the phosphor according to any one of the first to fifteenth aspects is provided, wherein by using a crucible composed of nitride as a firing crucible, raw materials are fired at temperature of 1400° C. or more and 2000° C. or less in an atmosphere containing one or more kind of gas selected from nitrogen gas, rare gas, and ammonia gas.

In a seventeenth aspect, the method of manufacturing the phosphor according to the sixteenth aspect is provided, wherein the raw materials are fired by setting pressure inside furnace at 0.5 MPa or less.

In a eighteenth aspect, the method of manufacturing the phosphor according to either of the sixteenth or seventeenth aspect is provided, wherein the crucible composed of nitride is a BN crucible.

In a nineteenth aspect, the method of manufacturing the phosphor according to any one of the sixteenth to eighteenth aspects is provided, wherein the raw materials are fired, with 0.1 ml/min or more gas containing one or more kind of gas selected from the nitrogen gas, rare gas, and the ammonia gas flowing inside the furnace.

In a twentieth aspect, the method of manufacturing the phosphor according to any one of the sixteenth to nineteenth aspect is provided, wherein the raw material is fired in a powdery state.

In a twenty-first aspect, an emission device is provided, having a phosphor according to any one of the first to fifteenth aspects and an emission part emitting light of a first wavelength, wherein the light with the wavelength different from the first wavelength is emitted from the phosphor, with a part of or the whole part of the light of the first wavelength as an excitation light.

In a twenty-second aspect, the emission device according to the twenty-first aspect is provided, wherein the first wavelength is in a range from 350 nm to 550 nm.

In a twenty-third aspect, the emission device according to either of the twenty-first or the twenty-second aspect is provided, wherein the emission part emitting the first wavelength is an LED.

(Advantages)

The phosphor according to any one of the first to tenth aspects, or the twelfth aspect has emission spectra with a broad peak in the range from green color to yellow color, or yellow color to red color, has a broad flat excitation band in the range from the near ultraviolet/ultraviolet to blue color, and has an improved emission intensity and luminance, and also has an excellent durability against heat and water.

The phosphor according to the eleventh aspect has a flat excitation band in the wavelength range from 350 nm to 550 nm. Therefore, even if there is a slight variation in the emission wavelength of the near ultraviolet/ultraviolet LED and the blue LED used as an excitation light of the one chip type white LED, disruption of balance in the emission intensity of each color does not occur, thereby allowing stable manufacture of the white LED illumination of the same color tone. Therefore, the phosphor of the eleventh aspect has a merit not only in quality but also in manufacturing cost.

The phosphor according to the thirteenth aspect has a high emission intensity and a high luminance even at a high temperature of 200° C. Therefore, even when coated on an LED chip, which is considered to become high temperature at emitting, the emission intensity and the luminance are not lowered, thereby allowing high luminance one chip type white LED illumination to be obtained. In addition, there is little change in emission characteristics due to heat, and therefore the design of the emission color of the white LED illumination becomes easy.

According to the phosphor of the fourteenth aspect or the fifteenth aspect, the phosphor thus obtained is in a powdery state, thereby allowing the phosphor to be coated on various places as a paste. In addition, the phosphor has a particle size of 1.0 µm to 20.0 µm, thereby allowing the coating application density to be increased, to make it possible to obtain a coated film with high emission intensity and luminance.

According to a method of manufacturing the phosphor according to any one of the sixteenth aspect to twentieth aspect, the phosphor according to any one of the first aspect to fifteenth aspect can be manufactured at inexpensive manufacturing cost.

According to an emission device according to any one of the twentieth aspect to twenty-third aspect, a high efficient emission device having a desired emission color and high emission intensity and luminance can be obtained.

BEST MODE FOR CARRYING OUT THE INVENTION

Figure 1:
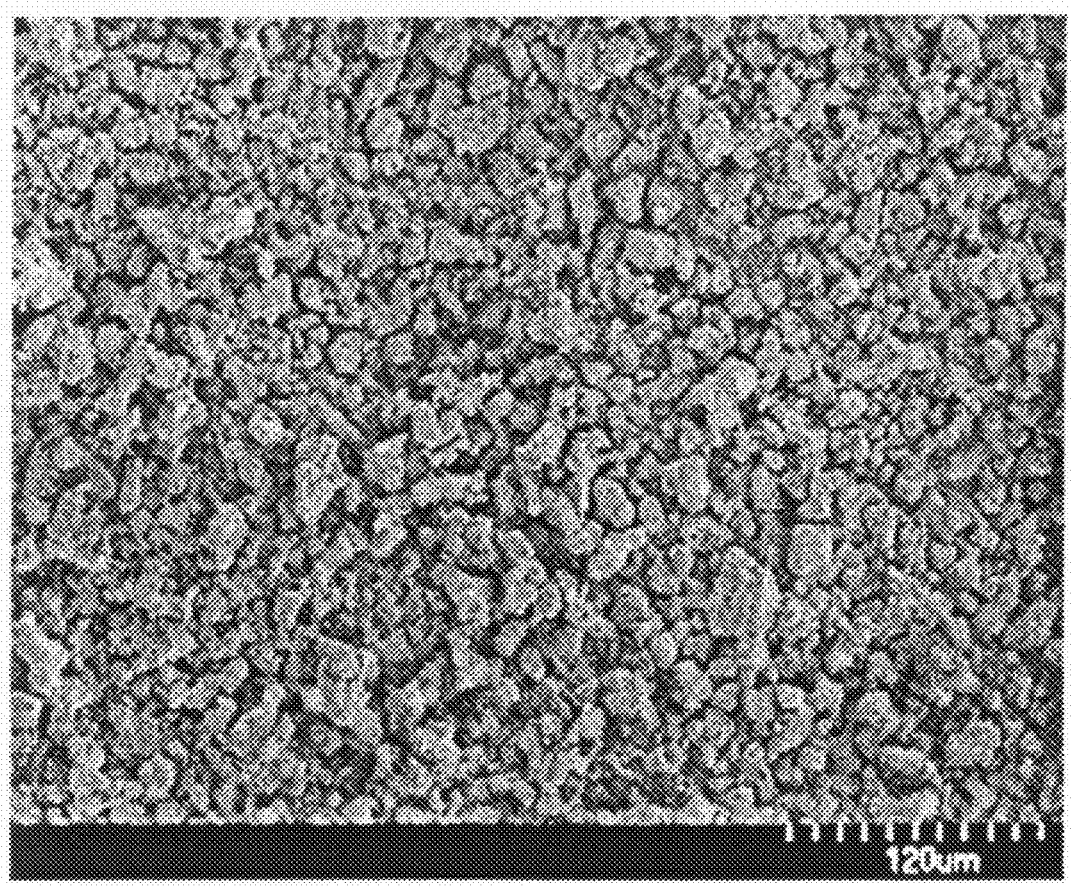
FIG. 1 is an SEM photograph of a phosphor powder of the example 1.

Examples of the present invention will be explained hereunder, however, the present invention is not limited thereto.

A phosphor of the present invention is the phosphor having a matrix composition given by a general formula expressed by $M_mA_aB_bO_oN_n$:Z. Here, element M is one or more kind of element selected from the elements having bivalent valency in the phosphor. Element A is one or more kind of element having tervalent valency, element B is one or more kind of element having tetravalent valency, O is oxygen, N is nitrogen, and element Z is the element acting as the activator in the phosphor and one or more kind of element selected from rare earth elements or transition metal elements.

Further, in the phosphor, $(a+b)/m$ is in a range satisfying $4.0<(a+b)/m<7.0$, $a/m$ is in a range satisfying $a/m \geq 0.5$, $b/a$ is in a range satisfying $b/a>2.5$, oxygen and nitrogen has a relation satisfying $n>o$, and nitrogen is expressed by $n=2/3\, m+a+4/3\, b-2/3\, o$, and more preferably, $a/m$ is in a range satisfying $0.5 \leq a/m \leq 1.5$, $b/m$ is in a range satisfying $3.5<b/m<6.5$, and oxygen is in a range satisfying $o<o/m<4.0$.

The phosphor of the present invention having the aforementioned characteristics has an emission spectrum with a broad peak in a range from green color to yellow color, or yellow color to red color, and has a flat excitation band in the broad range from near ultraviolet/ultraviolet to blue color (wavelength range from 350 nm to 500 nm), and is capable of obtaining a high efficient emission. Therefore, by mixing the phosphor and the phosphor of suitable other color, and combining the phosphor thus mixed and an emission part such as the near ultraviolet/ultraviolet LED and the blue LED and so forth, a high efficient emission having an excellent color rendering property, a desired emission color and high emission intensity and luminance can be obtained.

The phosphor of the present invention has a stronger emission intensity and has a broad peak of the emission spectrum, compared with a silicon nitride-based phosphor (for example see patent document 1) and a sialon-based phosphor (for example, see patent documents 2, 3, and 4), and oxynitride phosphor (for example, see patent documents 5 and 6). Therefore, the white LED illumination with further high luminance can be manufactured.

The excitation band has a broad range, and therefore it becomes possible to suppress change in color tone due to variation in emission elements (blue LED), differently from YAG:Ce phosphor. In addition, the phosphor of the present invention has a high efficient excitation band even in the vicinity of the wavelength from 380 nm to 410 nm, which is an emission wavelength of the near ultraviolet/ultraviolet LED. Accordingly, the phosphor of the present invention can also be used as a green color phosphor of the white LED illumination by combining not only with the blue color emitting LED, but also with the near ultraviolet/ultraviolet emitting LED, using a mixed state of the red color, blue color, and other color phosphors. Particularly, when the phosphor is irradiated with the excitation light of monochromatic color in the wavelength range from 350 nm to 550 nm, the phosphor activated by Eu as an activator has a significantly flat excitation band, wherein the relation is expressed by $(P_H-P_L)/P_H<0.20$, more preferably expressed by $(P_H-P_L)/P_H<0.10$, when the peak intensity of a maximum peak is defined as $P_H$ when the phosphor is irradiated with the excitation light whereby the peak intensity of the maximum peak in the spectrum of the light emission obtained by absorbing the excitation light is made to be largest, and the peak intensity of the maximum peak is defined as $P_L$ when the phosphor is irradiated with the excitation light whereby the peak intensity of the maximum peak in the spectrum of the light emission obtained by absorbing the excitation light is made to be smallest.

The emission wavelength is different depending on the activator, however when the phosphor is activated by Ce as a typical activator, the phosphor having the emission spectrum with a peak in a range from green color to yellow color can be obtained, and when activated by Eu, the phosphor having the emission spectrum with a peak in the range from yellow color to red color can be obtained. Therefore, the phosphor thus activated by Ce can be used by replacing the YAG:Ce phosphor presently used, or the ZnS:Cu, Al phosphors as phosphors capable of overcoming problems thereof. Further, the phosphor activated by Eu can be used for the white LED illumination as a different substance from the red phosphors such as $Ca_2Si_5N_8$:Eu, $Sr_2Si_5N_8$:Eu, $Ba_2Si_5N_8$:Eu, $Ca_x(Al,Si)_{12}(O,N)_{16}$:Eu (However, satisfying $0<x\leq 1.5$), $CaAl_2Si_4N_8$:Eu, $CaSiN_2$:Eu, $CaAlSiN_3$:Eu, which have been developed in recent years for improving color rendering properties of the white LED illumination.

In addition, the phosphor of the present invention has an excellent durability against heat and water. Although the conventional ZnS:Cu, Al phosphor having the emission spectrum with peak in the range from green color to yellow color has no problem in regard to the emission intensity and luminance, problems involved therein are that the ZnS:Cu, Al phosphor has no durability, particularly exhibiting a low degree of water tolerance, and further, the emission intensity and luminance are largely deteriorated at a high temperature. Therefore, when the white LED illumination is manufactured by mixing the ZnS:Cu, Al phosphor and the phosphors of plural colors and by combining with the near ultraviolet/ultraviolet LED, such a white LED illumination has the problem that when used for a long period of time, particularly the emission intensity and luminance of the ZnS:Cu, Al phosphor are deteriorated, resulting in changing in color tone. In addition, such a white LED illumination has the problem that due to a bad temperature characteristic of the ZnS:Cu, Al phosphor at a high temperature, when turning on the light of the white LED illumination, the emission intensity and luminance of the ZnS:Cu, Al phosphor are deteriorated due to the heat generated from the emission element, thereby also deteriorating the luminance of the white LED illumination accordingly. As a result, the ZnS:Cu, Al phosphor is required to adjust phosphor mixed powder in consideration of the change in the emission intensity and luminance due to temperature, making it difficult to manufacture the white LED illumination with stable quality. However, the phosphor of the present invention is the phosphor containing nitrogen, having durability, and strong against change in temperature and moisture, and therefore the white LED illumination having high luminance and excellent durability can be manufactured.

Finally, explanation will be given to a case in which the emission with high color rendering properties can be obtained by using the phosphor of the present invention.

Here, the color rendering properties means variation in the way of looks of the color of an object irradiated with light, depending on the kinds of the light source. Generally, the color rendering properties showing reproducibility of the color of an illuminated object can be expressed numerically by general color rendering index (Ra). If absolutely the same color as the color viewed with a reference light can be reproduced, the best color rendering index (Ra=100) is obtained, and the larger the difference in color thus reproduced is, the lower the Ra value is. (Ra<100) Of course, preferably, the way of looks of the color is the same as in the case of using the reference light. However, the reference light has a white light source having uniform intensity of the light over the whole visible light region. Meanwhile, the existing white LED illumination lacks in uniformity in the intensity of the light. For example, the intensity of the light is high in a certain wavelength region of the visible light, and low in a certain wavelength region. Therefore, in the wavelength region where the intensity of the light is insufficient, color reproducing properties are deteriorated, and the color rendering properties are deteriorated.

After all, in order to obtain the emission with high color rendering property, the phosphor used for the white LED illumination needs to have an emission spectrum with a broad peak, and the phosphor needs to have a sufficient emission intensity. With the phosphor of the present invention having the aforementioned matrix composition, the phosphor having a high emission intensity and luminance in the range from green color to yellow color, or from yellow color to red color, and having an emission spectrum with a broad peak of not less than 80 nm half value width can be obtained by changing the kind of the constituent element and the kind of the activator.

Detailed reason remains unknown for the fact that the phosphor of the present invention has the emission spectrum with a broad peak in the range from the green color to yellow color and from yellow color to red color, has the flat excitation band in the wavelength range from the near ultraviolet/ultraviolet to blue color, and is capable of emitting light with high efficiency. However, it can be considered as follows.

First, it can be considered that in the general formula $M_mA_aB_bO_oN_n$:Z of the phosphor according to the present invention, when the values of m, a, b, o, and n are in the range of $4.0<(a+b)/m<7.0$, $a/m \geq 0.5$, $b/a>2.5$, $n>o$, $n=2/3m+a+4/3b-2/3\,o$, the activator can exist regularly in a crystal structure of the phosphor, an excitation energy used for emitting light can be efficiently transferred, and an emission efficiency is thereby improved.

Further, with the aforementioned structure of the phosphor, it can be considered that chemically stable composition can be obtained, therefore an impurity phase not contributing to emitting light is hardly generated in the phosphor, and the reduction in the emission intensity is thereby suppressed. Specifically, it can be considered that when plural impurity phases are generated, a phosphor amount per unit area is reduced, and further the impurity phase thus generated absorbs light generated from the excitation light and the phosphor, therefore the emission efficiency of the phosphor is deteriorated, and the high emission intensity can not be obtained.

The aforementioned consideration is supported by the fact that when the values of m, a, b, o, and n are in the aforementioned range in an X-ray diffraction measurement for the phosphor after firing, an X-ray diffraction peak due to the impurity phase of an unreacted raw material such as AlN, and $Si_3N_4$, and the X-ray diffraction peak due to the impurity phase different from the phase contributing to emitting light are not checked, or even when checked, a significantly low diffraction intensity is observed. Meanwhile, when the values of m, a, b, o, and n are outside the aforementioned range, a remarkable X-ray diffraction peak of the AlN $Si_3N_4$ and the phase different from the phases contributing to emitting light is checked. Therefore, it can be considered that the characteristic that the X-ray diffraction peak due to the aforementioned impurity phase is not observed in the X-ray diffraction pattern for the phosphor after firing, shows that the phosphor to be measured has a high emission intensity and a flat excitation band over the range from the near ultraviolet/ultraviolet color to blue color.

In the phosphor of the present invention, the general formula is given as $M_mA_aB_bO_oN_n$:Z, where preferably the values of m, a, b, o, and n are given satisfying $4.0<(a+b)/m<7.0$, $a/m>0.5$, $b/a>2.5$, $n>o$, $n=2/3m+a+4/3\,b-2/3\,o$, further preferably satisfying $0.5<a/m<1.5$, $3.5<b/m<6.5$, $0<o/m<4.0$. This is because if the value of a/m is smaller than 1.5, the site of the element B to be replaced by the element A is prevented from becoming excessive, and therefore deterioration of the emission efficiency caused by deflection due to manufacturing conditions is prevented. In addition, the AlN has a high melting point, and therefore if the value of a/m is smaller than 1.5, productivity at manufacturing can be improved. Further, if the value of b is larger than that of a, sintering is restrained, and powdery form can be easily obtained after firing. Therefore, preferably the range of b/m is larger than that of a/m, satisfying $3.5<b/m<6.5$.

Although $n>o$ is satisfied in the phosphor of the present invention, it is preferable to contain a slight amount of oxygen. If judging from the result of the example as will be described later, the emission intensity of the phosphor is strongest, when an amount of the oxygen is in a proper range. Further, when the amount of the oxygen is in the proper range, the phosphor is prevented from being formed into glass due to an excessive amount of the oxygen, and therefore preferably, the manufacture of the phosphor in a powdery form is facilitated. Specifically, when an oxygen content is in the proper range, the emission characteristic of the phosphor can be improved, and this is preferable from the viewpoint of productivity. The proper range of the oxygen content is beyond 0.5 wt % and under 10.0 wt % of the mass of the phosphor, and this provides the phosphor with improved emission characteristic, preventing it from being formed into glass, and capable of sufficiently realizing practical use. At this time, in the general formula $M_mA_aB_bO_oN_n$:Z of the phosphor, the range of o calculated by the raw material and the mixing ratio thereof to be used is defined as satisfying $0<o/m<4.0$, when the aforementioned oxygen content is taken into consideration. Further preferably, the oxygen content is beyond 0.5wt % and under 6.0 wt %, and the range of o is given as satisfying $0<o/m<3.0$.

The reason for a slightly different value between the value of o calculated by a result of composition analysis, and the value of o calculated by the mixing ratio of the raw material to be used, which are compared with each other, is considered to be that the oxygen initially contained in the raw material and the oxygen stuck to the surface, the oxygen mixed therein by oxidization of the surface of the raw material at measuring, mixing, and firing the raw material, and further the oxygen adsorbed on the surface of the phosphor after firing, are not taken into consideration.

Further, in the phosphor having the composition expressed by the aforementioned general formula $M_mA_aB_bO_oN_n$:Z, element M is one or more kinds of elements having +bivalent valency, element A is one or more kinds of elements having +tervalent valency, element B is one or more kinds of elements having +tetravalent valency, and nitrogen is element having −tervalent valency. Therefore, the values of m, a, b, o, and n are the composition expressed by $n=2/3\,m+a+4/3\,b-2/3\,o$, and the value obtained by adding the valency of each element becomes zero, and preferably the phosphor thus described serves as a further stable compound. Particularly, it was found that when the oxygen content was expressed satisfying $0.8 \leq a/m \leq 1.2$, $4.0 \leq b/m \leq 6.0$, and $0.0<o/m \leq 3.0$, the phosphor with the characteristic of having a high emission intensity and a flat excitation band over the range from the near ultraviolet/ultraviolet color to blue color was obtained. In any case, slight deviation in composition from a composition formula showing the composition of the phosphor is allowable.

Meanwhile, preferably the element M is one or more kind of element selected from a group consisting of Mg, Ca, Sr, Ba, Zn, and rare earth elements having bivalent valency, further preferably is one or more kind of element selected from a group consisting of Mg, Ca, Sr, Ba, and Zn, and most preferably is Sr.

Preferably the element A is one or more kind of element selected from a group consisting of Al, Ga, In, Tl, Y, Sc, P, As, Sb, and Bi, further preferably is one or more kind of element selected from a group consisting of Al, Ga, and In, and most preferably is Al. In regard to the Al, preferably AlN, which is a nitride, is used as a general thermoelectric material and a structural material, and easily available at an inexpensive cost, and brings small environmental loading.

Preferably the element B is one or more kind of element selected from a group consisting of Si, Ge, Sn, Ti, Hf, Mo, W, Cr, Pb, and Zr, further preferably is Si and/or Ge, and most preferably is Si. In regard to the Si, preferably $Si_3N_4$, which is a nitride, is used as a general thermoelectric material and a structural material, and easily available at an inexpensive cost, and brings small environmental loading.

The element Z is one or more kind of element selected from the rare earth elements or the transitional elements mixed in the form of replacing a part of the element M in the matrix structure of the phosphor. From the viewpoint of exerting a sufficient color rendering property for various light sources including the white LED illumination using the phosphor of the present invention, it is preferable for the phosphor to have a broad half width value of the peak in the emission spectrum. From this viewpoint, preferably, the element Z is one or more kind of element selected from a group consisting of Eu, Mn, Ce, Tb, and Pr. Among these elements, when Ce is used as the element Z, the phosphor shows the emission spectrum with broad and high in emission intensity in the range from green color to yellow color, and therefore the element Z is preferable as an activator of each kind of light source including the white LED illumination.

Although a silicon nitride-based phosphor, a sialon-based phosphor, and oxynitride phosphor of patent documents 1 to 6 proposed heretofore emits light from green color to yellow color by activating Ce, the emission intensity is significantly deteriorated compared with a case in which the same matrix is activated by Eu, thus making it impossible to be practically used. However, the present invention provides the phosphor of a proper composition to obtain the emission spectrum with a peak in a broad range and high in emission intensity, and therefore is capable of obtaining the emission intensity of not less than 1.5 times that of the phosphor of each patent document, having the characteristic of sufficiently being put to practical use. Further, when the white LED illumination is manufactured by the near ultraviolet/ultraviolet LED, the phosphor of the present invention has a significantly broad peak in the emission spectrum, and therefore the white LED illumination improved in efficiency and excellent in color rendering property can be manufactured. Further, a noteworthy point is that even when the matrix is activated by Eu, the emission intensity is not deteriorated, but instead showing the emission spectrum with a peak in a broad range and high in the emission intensity from yellow color to red color.

Moreover, by selecting the element Z, the peak wavelength of light emission in the phosphor of this example can be changed, and also by activating the element Z, the peak wavelength can be changed and further by a sensitizing property, the emission intensity and the luminance can be improved.

As described above, preferably typical phosphors of this example include $Sr_6Al_6Si_{18}O_3N_{32}$:Ce, $SrAlSi_3ON_5$:Ce, $Sr_3Al_3Si_9O_6N_{13}$:Ce, $Sr_6Al_6Si_{24}O_3N_{40}$:Ce, $Sr_3Al_3Si_{12}O_3N_{19}$:Ce, $Sr_3Al_3Si_{12}O_6N_{17}$:Ce, $Sr_6Al_6Si_{27}O_3N_{44}$:Ce, $Sr_2Al_2Si_9O_2N_{14}$:Ce, $Sr_6Al_6Si_{27}O_{12}N_{38}$:Ce, $Sr_2Al_2Si_{10}ON_{16}$:Ce, $Sr_3Al_3Si_{15}O_3N_{23}$:Ce, $SrAlSi_5O_2N_7$:Ce, $Sr_6Al_6Si_{36}O_3N_{56}$:Ce, $SrAlSi_6ON_9$:Ce, $Sr_3Al_3Si_{18}O_6N_{25}$:Ce, $Sr_6Al_6Si_{18}O_3N_{32}$:Eu, $SrAlSi_3ON_5$:Eu, $Sr_3Al_3Si_9O_6N_{13}$:Eu, $Sr_6Al_6Si_{24}O_3N_{40}$:Eu, $Sr_3Al_3Si_{12}O_3N_{19}$:Eu, $Sr_2Al_{Si/12}O_6N_{17}$:Eu, $Sr_6Al_6Si_{27}O_3N_{44}$:Eu, $Sr_2Al_2Si_9O_2N_{14}$:Eu, $Sr_6Al_6Si_{27}O_{12}N_{38}$:Eu, $Sr_2Al_2Si_{10}ON_{16}$:Eu, $Sr_3Al_3Si_{15}O_3N_{23}$:Eu, $SrAlSi_5O_2N_7$:Eu, $Sr_6Al_6Si_{36}O_3N_{56}$:Eu, $SrAlSi_6ON_9$:Eu, $Sr_3Al_3Si_{18}O_6N_{25}$:Eu. The present invention is not limited thereto, but excellent characteristic is shown if the scope of the claims is satisfied.

An amount of the element Z to be added is preferably in the range of not less than 0.0001 and not more than 0.50 in a molar ratio z/(m+z) of the element M and the element Z as an activator, when the general formula of the phosphor of this example is expressed by the general formula MmAaBbOoNn:Zz (satisfying 4.0<(a+b)/m<7.0, a/m≧0.5, b/a>2.5, n>o, n=2/3 m+a+4/3 b−2/3 o). When the molar ratio z/(m+z) of the element M and the element Z is in the aforementioned range, it can prevent the deterioration in the emission efficiency caused by concentration quenching generated by an excessive content of the activator (element Z), and meanwhile, it can also prevent the deterioration in the emission efficiency caused by the deficient of the element contributing emitting light due to too small content of the activator (element Z). Further, it is preferable to set the value of the z/(m+z) is within the range of not less than 0.001 and not more than 0.30. However, an optimal value of the range of the value of z/(m+z) is slightly fluctuated by the kind of the activator (element Z) and the kind of the element M. Further, by controlling the amount of the activator (element Z) to be added, the peak wavelength of the light emission of the phosphor can be set by shifting, which is useful for adjusting the luminance in the light source thus obtained.

In the phosphor (general formula MmAaBbOoNn:Z) of this embodiment, when Sr was selected as the element M, Al was selected as the element A, Si was selected as the element B, and Ce was selected as the element Z, satisfying 4.0<(a+b)/m<7.0, 0.8≦a/m≦1.2, 4.0≦b/m≦6.0, 0<o/m≦3.0, n=2/3m+a+4/3b-2/3o, a weight ratio of the element constituting the aforementioned phosphor was obtained, such as Sr of 20.0 wt % to 27.0 wt %, Al of 5.0 wt % to 9.0 wt %, Si of 30.0 wt % to 39.0 wt %, 0 of 0.5 wt % to 6.0 wt %, N of 26.0 Wt % to 32.0 wt %, and Ce of beyond 0 to 3.5 wt % (Oxygen and Ce in a preferable range was selected, estimating an error of ±1.0wt % for Sr and Al and ±2.0 wt for Si). When the phosphor is irradiated with one or more kind of monochromatic light or mixed light of the monochromatic light having the wavelength range from 350nm to 500nm as an excitation light, the peak wavelength of the emission spectrum became in the wavelength range from 500 to 600 nm. At this time, the phosphor exhibited a sufficient emission intensity and exhibited a preferable emission characteristic of having a chromaticity (x, y) of the emission spectrum, with x in the range from 0.3500 to 0.4500, and y in the range from 0.5000 to 0.6000.

In addition, when Sr was selected as the element M, and Al was selected as the element A, Si was selected as the element B, and Eu was selected as the element Z, satisfying 4.0<(a+b)/m<7.0, 0.8≦a/m≦1.2, 4.0≦b/m≦6.0, 0<o/m≦3.0, n=2/3m+a+4/3b- 2/3 o, the weight ratio of the element constituting the aforementioned phosphor was obtained, such as Sr of 20.0 wt % to 27.0 wt %, Al of 5.0 wt % to 9.0 wt %, Si of 30.0 wt % to 39.0 wt %, O of 0.5 wt % to 6.0 wt %, N of 26.0 wt% to 32.0 wt %, and Eu of beyond 0 to 3.5 wt % (error of ±1.0 wt % for Sr and Al, and error of ±2.0 wt % for Si are estimated). When the phosphor is irradiated with one or more kind of monochromatic light or mixed light of the monochromatic light having the range from 350 nm to 550 nm as an excitation light, the peak wavelength of the emission spectrum became in the range from 550 to 650 nm. At this time, the phosphor exhibited a sufficient emission intensity and exhibited a prefereable emission characteristic of having a chromaticity (x,y) of the emissiojn spectrum, with x in the range from 0.4500 to 0.6000, and y ine range from 0.3500 to 0.5000.

In a powder X-ray diffraction pattern by CoKα, a product phase contained in the phosphor of this example has characteristic peaks in a brag angle (2θ) range of 12.5 to 13.5°, 21.0 to 22.0°, 22.5 to 23.5°, 26.5 to 27.5°, 28.5 to 29.5°, 34.0 to 35.0°, 35.5 to 36.5°, 36.5 to 37.5°, 41.0 to 42.0°, 42.0 to 43.0°, 56.5 to 57.5°, 66.0 to 67.0°. Among these ranges, the peaks in the brag angle (2θ) range of 28.5° to 29.5°, 35.5° to 36.5°, 41.0° to 42.0° are strong in intensity, and the peak in these ranges becomes particularly characteristic. When these peaks are set to be a, b, c, respectively, and a peak ratio of the peaks a and c to the peak b is expressed by I(a/b), I(c/b), by changing a mixing composition within the composition range of the phosphor, the I(a/b) and I(c/b) are changed in the range of 0.02<I(a/b), I(c/b)<1.5. When the I(a/b), I(c/b) is in the range of 0.20<I(a/b), I(c/b)<0.80, the phosphor is excellent in the emission intensity and the luminance, and when the I(a/b) and I(c/b) is in the range of I(a/b)<0.60, and I(c/b)<0.60, preferably the phosphor is excellent in both the emission intensity and the luminance, and temperature characteristic.

Next, the temperature characteristic of the phosphor of this example will be explained. In some cases, the phosphor is used not only as the white LED illumination, but under high temperature environment. Accordingly, when the phosphor whose emission intensity is deteriorated in association with an increase of the temperature, and whose emission characteristic is deteriorated in association with thermal deterioration, such a phosphor is not preferable. For example, although a sulfide phosphor is excellent in the emission characteristic, there are plural sulfide phosphors in which the emission intensity is deteriorated in association with the increase of the temperature, and the emission characteristic is deteriorated by the thermal deterioration. Meanwhile, the phosphor of this example exhibits an excellent temperature characteristic and heat resistance, and when the value of a relative intensity of a maximum peak in the emission spectrum at 25° C. is defined as $P_{25}$, when the phosphor is irradiated with the monochromatic light or the mixed light of the monochromatic light in the range from near ultraviolet/ultraviolet to green color as an excitation light, and the value of the relative intensity of the maximum peak of the phosphor at 200° C. is defined as $P_{200}$ when the phosphor is irradiated with the aforementioned excitation light, the relation is expressed satisfying $(P_{25}-P_{200})/P_{25} \times 100 \leq 35$. This is because AlN and $Si_3N_4$, which are high temperature materials, are used for the raw materials, and therefore a tetrahedral ($SiN_4$) is assembled into a network, like sialon, to exhibit an excellent temperature characteristic. In addition, a slight amount of oxygen is contained therein, and this is one of the reasons for exhibiting the excellent temperature characteristic and the heat resistance.

By forming the phosphor of this example in a powdery state, the phosphor can be easily applied to various light sources including the white LED illumination. Here, when the phosphor is used in a powdery state, preferably the phosphor contains a primary particle with particle size of 20 μm or less and aggregates in which the primary particle agglutinates, wherein the an average particle size (D50) of the powdery phosphor containing the primary particle and the aggregates is not less than 1.0 μm and not more than 20.0 μm. The reason is considered as follows:

when the average particle size is 20 μm or less, it can be easily pulverized thereafter;

since the emission occurs mainly on the surface of a particle in the phosphor powder, a surface area per unit weight of powder can be secured and the deterioration of the luminance is thereby prevented; further when the powder is formed into a paste, which is then applied on a light emitter element, density of the powder can be increased; and from this viewpoint also, the deterioration of the luminance can be prevented. Also, according to the study of the present inventors, although detailed reason was unknown, it was found that preferably the average particle size is larger than 1.0 μm from the viewpoint of the emission efficiency of the phosphor powder. As described above, the average particle size of the powder in the phosphor of this example is not less than 1.0 μm and not more than 20 μm.

The phosphor of this example has the emission spectrum with a peak in the range from green color to yellow color, and yellow color to red color, having a broad peak form, and therefore it is preferable as the white LED illumination from the viewpoint of color rendering properties. Further, the excitation band is flat in the broad range of near ultraviolet/ultraviolet to blue color (wavelength range from 350 to 500 nm). Therefore, the phosphor of this example provides a state close to a maximum emission intensity in any case such as the case of the white LED illumination of a system to obtain white color by utilizing a complementary relation between a blue light emission of the high luminance blue LED (in the vicinity of the wavelength of 460 mm) proposed as the one chip type white LED illumination and yellow light emission of the phosphor, or the case of the white LED illumination of the system obtaining white color by utilizing the mixed state of colors of the light obtained from the phosphors of R, G, and B, and other colors by combining the LED emitting light of near ultraviolet/ultraviolet (in the vicinity of the wavelength of 380 to 410 nm), red color(R) emitting phosphor excited by the near ultraviolet/ultraviolet light generated from the LED, green color (G) emitting phosphor, and blue color (B) emitting phosphor. Namely, by combining the emission part emitting light from the near ultraviolet/ultraviolet to blue color and the phosphor, the white light source and the white LED illumination with high output and improved color rendering properties, and further an illumination unit using the same can be obtained.

For example, the phosphor of this example in a powdery state is combined with the emission part (such as LED) emitting the light in the wavelength range from 350 nm to 550 nm) by a known method, with a part of or the whole part of the light emitted by the emission part as the excitation light, the light can be emitted with a different wavelength from the wavelength of the light emitted by the emission part. This contributes to manufacturing various back light devices for display and the illumination unit. Further, for example, by combining the phosphor of this example in a powdery state with a discharge lamp generating ultraviolet light in the known method, a fluorescent lamp and the illumination unit, and the back light device for display can be manufactured. Also, by combining the phosphor of this example in a powdery state with ultraviolet to blue color emitting LED emission element by the known method, the illumination unit and the back light device for display can be manufactured.

Next, in regard to the manufacturing method of the phosphor of this example, manufacture of $Sr_2Al_2Si_9O_2N_{14}$:Ce (wherein Ce/(Sr+Ce)=0.030) will be explained as an example. In the $Sr_2Al_2Si_9O_2N_{14}$:Ce, $CeO_2$ is used as the raw material of the activator Ce. When the oxygen in the $CeO_2$ is taken into consideration, and the phosphor is expressed by using the general formula MmAaBbOoNn:Zz, the phosphor is expressed by $Sr_{1.940}Al_2Si_9O_{2.06}N_{14}$:$Ce_{0.060}$. Note that there is no difference between z/(m+z) and Ce/(Sr+Ce).

Generally, in many cases, the phosphors are manufactured by a solid-phase reaction, and the phosphor of this example can be also obtained by the solid-phase reaction. However, the manufacturing method is not limited thereto. Each raw material of the element M, the element A, the element B may be obtained by the raw material commercially available, such as nitride, oxide, carbonate, hydroxide, and a basic carbonate. However, higher purity is more preferable, and preferably, the raw material of 2N or more, further preferably the raw material of 3N or more is prepared. The particle size of each particle of the raw material is preferably a fine particle, in terms of accelerating the reaction. However, the particle size and a form are changed, depending on the particle size and the form of the phosphor obtained. Therefore, the raw material of the nitride and so forth having an approximate particle size in accordance with the particle size and the form required for the phosphor finally obtained may be prepared. As the raw material of the element Z also, the commercially available nitride, oxide, carbonate, hydroxide, basic carbonate, or simple metal is preferable. Of course, the higher purity of each raw material is more preferable, and the raw material of 2N or more, and further preferably the raw material of 3N or more are prepared. Particularly, when the carbonate is used as the raw material of the element M, an effect of flux can be obtained without adding a compound composed of the element not contained in the composition element of the phosphor of this embodiment, as flux (reaction accelerator).

When manufacturing $Sr_2Al_2Si_9O_2N_{14}$:Ce (where Ce/(Sr+Ce)=0.030), for example, preferably $SrCO_3$(3N), AlN(3N), $Si_3N_4$(3N) are respectively prepared as the raw materials of the element M, the element A, the element B, and $CeO_2$(3N) is prepared as the element Z. 0.970 mol of $SrCO_3$, 1.0 mol of AlN, 4.5/3 mol of $Si_3N_4$, and 0.030 mol of $CeO_2$ of the raw materials are weighed and mixed so that a molar ratio of each element is Sr:Al:Si :Ce=0.970:1:4.5:0.030. The carbonate is used as a Sr raw material. This is because when the raw material with low melting point such as carbonate is used, the raw material itself serves as flux to accelerate the reaction and improve the emission characteristic, while an oxide raw material has a high melting point and the effect of flux can not be expected.

In addition, when the oxide is used as the raw material, another substance may be added as the flux. However, in this case, it must be careful that the flux becomes impurity, and there is a possibility that the characteristic of the phosphor is deteriorated. The weighing and mixing may be performed in an atmospheric air. However, the nitride in each raw material element is easy to be influenced by humidity, and therefore it is convenient to operate in a glove box under an inactive atmosphere where humidity is adequately removed. Either of a dry system or a wet system may be used as a mixing system. However, the raw material is decomposed when pure water is used as a solvent of the wet mixing. Therefore, a suitable organic solvent must be selected. A usual device such as a ball mill and a mortar may be used.

The raw material thus completed in mixing is put in a crucible, and retained and fired at 1400° C or more, preferably 1500° C or more or 1600° C or more, further preferably not less than 1700° C and not more than 2000° C for 30 minutes in the atmosphere containing one or more kind of gas selected from inactive gas such as nitrogen and rare gas and ammonium gas. If a firing temperature is 1400° C or more, it is difficult to generate the impurity phase excited by ultraviolet rays and emitting blue light, and further, the solid-phase reaction is preferably advanced and the phosphor excellent in emission characteristic can be obtained. Moreover, if the firing temperature is 2000° C or less, excessive sintering and melting can be prevented from occurring. Note that higher firing temperature allows the solid-phase reaction to be rapidly advanced, and a retaining time can thereby be shortened. Meanwhile, even when the firing temperature is low, a target emission characteristic can be obtained by keeping the temperature for a long time. However, longer firing temperature allows a particle growth to be advanced, and a particle form becomes large. Therefore, the firing time may be set in accordance with a target particle size.

Pressure in a furnace during the firing is preferably 0.5 MPa or less, and further preferably 0.1 MPa. This is because by firing under the pressure of 0.5 MPa or less, too advanced sintering between particles can be prevented, and pulverizing after firing is facilitated. An $Al_2O_3$ crucible, $Si_3N_4$ crucible, an AlN crucible, a sialon crucible, a C (carbon) crucible, and a BN (boron nitride) crucible or the like which can be used in the aforementioned gas atmosphere may be used as a crucible. However, preferably when the BN crucible is used, intrusion of impurities can be averted.

In addition, preferably during firing, preferably the aforementioned gas atmosphere flows with a flow rate of 0.1 ml/min, for example. This is because by flowing the atmosphere containing one or more kind of gas selected from the aforementioned nitrogen, inactive gas such as rare gas and animonium gas, it is prevented that the gas generated from the raw material is filled in the furnace to have influence on the reaction, resulting in the deterioration in the emission characteristic of the phosphor. Particularly, when the carbonate, the hydroxide, and the basic carbonate are used for the raw material, a large amount of gas is generated. Therefore, it is preferable to make the gas flow in a firing furnace and exhaust the gas thus generated.

In this example, preferably the raw material is fired in a state of powder. In a general solid-phase reaction, by dispersion of atoms in contact points of the raw materials, the reaction is promoted. This is taken into consideration, and in many cases, the raw material is formed into a pellet and fired, to accelerate the reaction uniformly over the entire raw material. However, in a case of the raw material of the phosphor of this example, the raw material is fired in a powder state, easy to pulverize after firing, and a primary particle is formed in an ideal spherical shape. Thus, the phosphor raw material of this invention is easy to treat as a powder. Further, when the carbonate, the hydroxide, and the basic carbonate are used as raw materials, $CO_2$ gas is generated by the decomposition of the raw material during firing. However, the raw material in a powder state would fully come out, and therefore from the viewpoint of not having a negative influence on the emission characteristic, this is a preferable structure.

After completing the firing, an object thus fired is taken out from the crucible, pulverizing means such as the mortar and the ball mill is used to pulverize the raw material to a predetermined average size, and the phosphor of the composition expressed by $Sr_2Al_2Si_9O_2N_{14}$:Ce (where Ce/(Sr+Ce) = 0.030) can be manufactured. The phosphor thus obtained is then subjected to cleaning, classifying, and surface treatment, as needed.

When other element is used as the element M, the element A, the element B, and the element Z, and when an amount of activation of Ce, which is the activator, is changed, by adjusting a blending amount of each raw material at mixing to a predetermined composition ratio, the phosphor can be manufactured by the same manufacturing method as the aforementioned method.

EXAMPLE 1

Commercially available $SrCO_3$(3N), AlN(3N), $Si_3N_4$(3N), and $CeO_2$(3N) were prepared, and among the raw materials, 0.970 mol of $SrCO_3$, 1.0 mol of AlN, 4.5/3 mol of $Si_3N_4$, and 0.030 mol of $CeO_2$ were weighed and mixed by using a mortar in an atmospheric air. The raw material thus mixed was put in a BN crucible, then temperature is increased to 1800° C. with an in-furnace pressure of 0.05 MPa set at 15° C./min, retained and fired at 1800° C. for three hours, and then cooled from 1800° C. to 200° C. for one hour. Thereafter, the firing sample thus fired was crushed to a proper particle size by using the mortar in the atmospheric air, and the phosphor of the example 1 of the composition formula expressed by $Sr_2Al_2Si_9O_2N_{14}$:Ce (where Ce/ (Sr+Ce)=0.030) was obtained. Note that this composition formula is the composition calculated by a blending ratio of used raw materials. A result of a composition analysis of the powdery phosphor thus obtained is shown in table 1, and an SEM photograph of the powdery phosphor (250 times) is shown in FIG. 1.

The result of the composition analysis of the phosphor thus obtained was close to a theoretical value obtained from atomic weight and a molar ratio of a constitutive element. A slight deviation is considered to be caused by a measurement error or impurities mixed in during manufacturing the phosphor. Specific surface area was 0.285 $m^2$/g. Also, as clarified from FIG. 1, the powdery phosphor thus obtained was aggregates in which primary particles of 20 μm or less agglutinates. When the average particle size (D50) was measured by a Laser Doppler measuring method, the D50 was 17.5 μm, and it was found that the value of not less than 1.0 μm and not more than 20.0 μm which is preferable as the phosphor was obtained. The size of the primary particle observed by an SEM diameter was 13.0 Next, the emission spectrum of the phosphor of the example 1 was measured. The measurement result was shown in table 2, and further described in FIG. 2 and FIG. 3.

Figure 2:
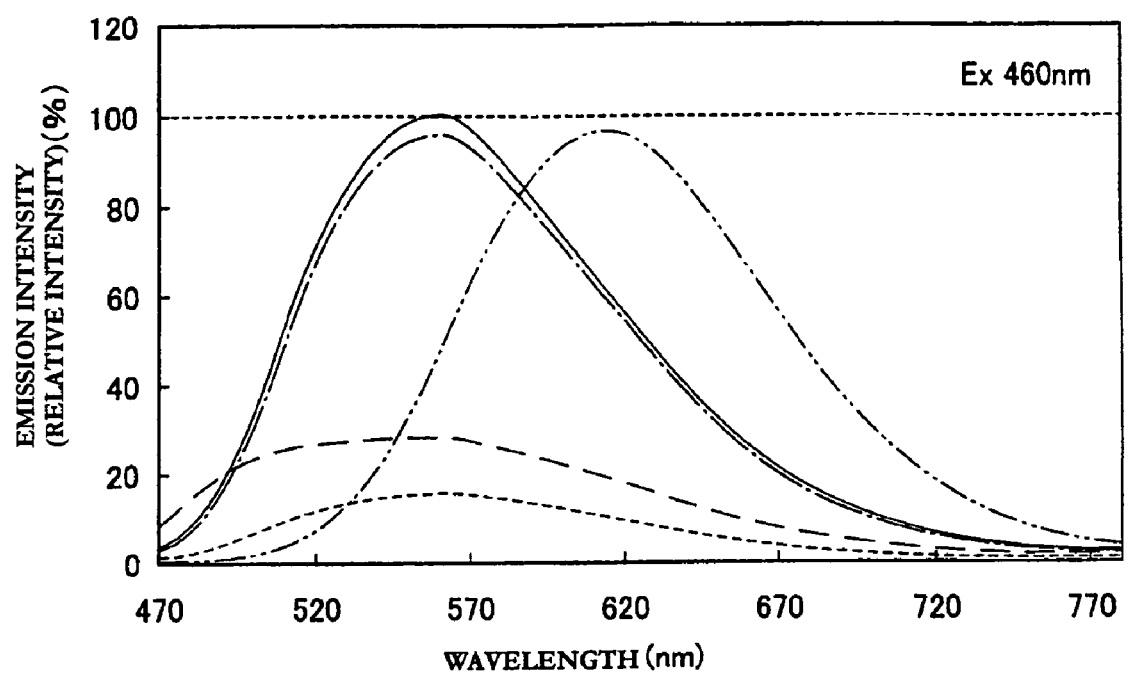
FIG. 2 is a graph showing an emission spectrum when the phosphors of the examples 1 to 3 and the comparative examples 1 and 2 are irradiated with a monochromatic light with the wavelength of 460 nm.
Figure 3:
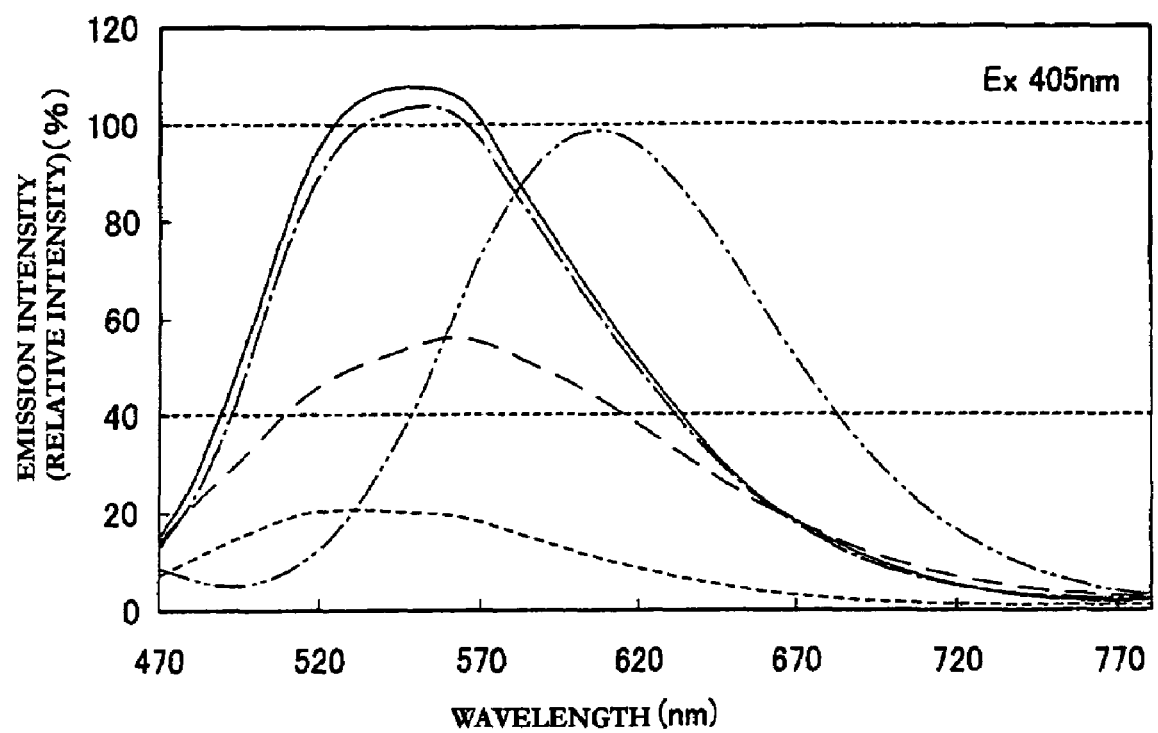
FIG. 3 is a graph showing the emission spectrum when the phosphors of the examples 1 to 3 and the comparative examples 1 and 2 are irradiated with the monochromatic light with the wavelength of 405 nm.

FIG. 2 and FIG. 3 are graphs where the emission intensity of the phosphor of the example 1 is taken on the ordinate axis as an relative intensity, and the wavelength of light is taken on the abscissa axis. Here, the emission spectrum is a spectrum of the light released from the phosphor when the phosphor is irradiated with the light or energy of some wavelength. The spectrum of the light emitted from the phosphor is shown by using a solid line, when the phosphor is irradiated with the monochromatic light with the wavelength of 460 nm as the excitation light, and when the phosphor is irradiated with the monochromatic light with the wavelength of 405 nm as the excitation light in the same way.

First, by using FIG. 2, the emission spectrum of the phosphor will be explained.

As obvious from the solid line of FIG. 2, the phosphor had the emission spectrum with a broad peak over the broad wavelength region from 470 nm to 770 nm, and the peak wavelength thereof was 559.3 nm. (the emission intensity at this time and the relative intensity of the luminance were set to be 100%). In addition, the half value width obtained was 117.2 nm, and the chromaticity (x, y) of the emission spectrum obtained was x=0.4156, and y=0.5434. Powder had a yellow fluorescent color, and a yellow emission color could be visually checked. The phosphor of the example 1 had a peak with extremely broad half value width over the broad wavelength region, and therefore when used as the phosphor for the one chip type white LED illumination, the white LED illumination having excellent color rendering properties can be manufactured, compared with the phosphor having a sharp peak. In the case of the phosphor having the sharp peak, the spectrum close to solar light is realized, and therefore several kinds of phosphors are required to be mixed. However, such a phosphor has a broad peak, and therefore the number of the kinds of the phosphors to be mixed can be decreased, and the white LED illumination can be manufactured at a low cost.

Table 2 and the solid line of FIG. 3 show a measurement result of the emission spectrum when the phosphor is irradiated with the monochromatic light with the wavelength of 405 nm as an excitation light. In this case, the phosphor had a broad peak in the broad wavelength range from 470 nm to 770 nm in the excitation wavelength of 405 nm also, and the peak wavelength was 552.3 nm. (in regards to the emission intensity and the luminance, a peak value of the emission spectrum is defined as the relative intensity 100%, when the phosphor of the example 1 is irradiated with the monochromatic light with the wavelength of 460 nm as the excitation light.) In addition, the half value width obtained was 119.5 nm. The chromaticity (x, y) of the emission spectrum was expressed by x=0.3730 and y=0.5377. Note that the yellow emission color could be visually checked.

Figure 4:
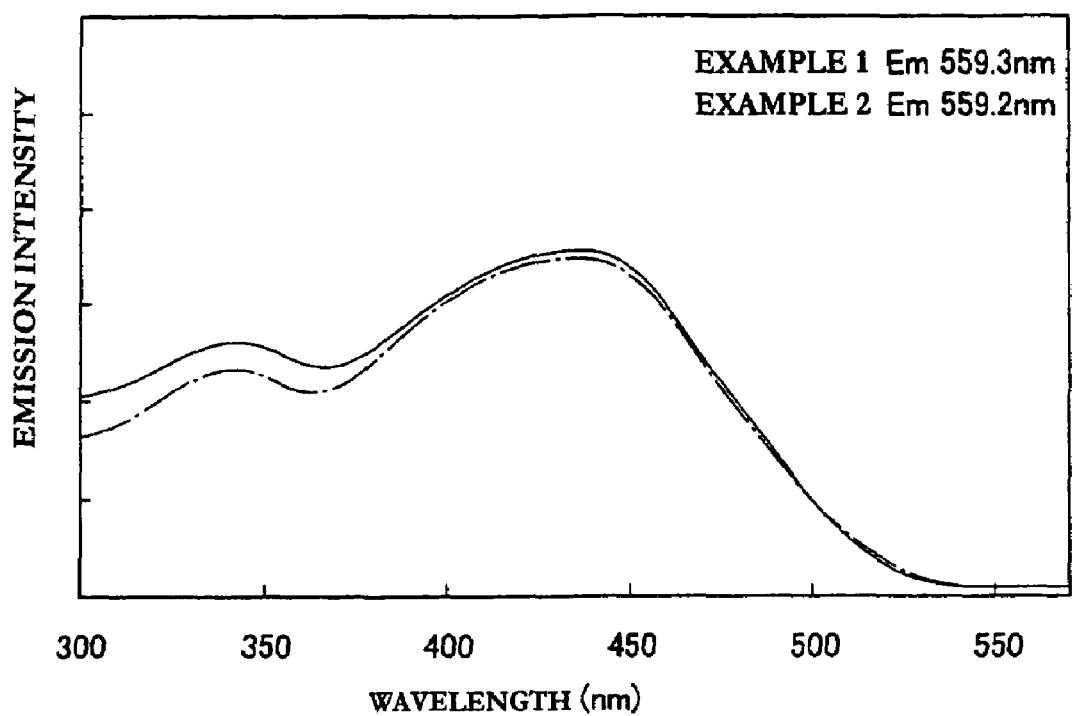
FIG. 4 is a graph showing an excitation spectrum of the phosphors of the examples 1 and 2.

Next, an excitation spectrum of the phosphor of the example 1 will be explained, by using FIG. 4. FIG. 4 is a graph in which the emission intensity of the phosphor is taken on the ordinate axis, and the wavelength of the excitation light is taken on the abscissa axis. Here, by the excitation spectrum, the phosphor to be measured is excited by using the monochromatic light with various wavelengths as the excitation light, the emission intensity of the light with a fixed wavelength emitted by the phosphor is measured, and the dependency of the emission intensity on the excitation wavelength is measured. In this measurement, the phosphor of the example 1 is irradiated with the monochromatic light with the wavelength from 300 nm to 570 nm, and the dependency of the emission intensity of the light with the wavelength of 559.3 nm emitted by the phosphor, on the excitation wavelength is measured.

The solid line of FIG. 4 shows the excitation spectrum of the phosphor of the example 1. As obvious from the solid line of FIG. 4, it was found that the excitation spectrum of the phosphor of present invention showed the light emission of yellow color with high intensity, by the excitation light of a broad wavelength range from 300 nm or around to 500 nm. Particularly, the phosphor has a particularly excellent excitation band in the vicinity of 460 nm and 405 nm, which are emission wavelengths of the blue LED and the near ultraviolet/ultraviolet LED used as the excitation light for the one chip type white LED illumination at present.

Similarly, in regards to the emission intensity and the luminance of example 2, example 3, comparative example 1, comparative example 2, and comparative example 3 as will be explained hereafter, the peak value of the emission spectrum is defined as the relative intensity 100%, when the phosphor of the example 1 is irradiated with the monochromatic light with the wavelength of 460 nm as the excitation light.

EXAMPLE 2

In the example 2, the phosphor of the example 2 is manufactured in the same way as the example 1, other than the molar ratio of each element of the example 1 is set to be Sr: Al : Si :Ce=0.970:1:5:0.030.

The commercially available $SrCO_3$(3N), AlN(3N), $Si_3N_4$ (3N), $CeO_2$(3N) were prepared, and each raw material was measured in 0.970 mol of $SrCO_3$, 1.0 mol of AlN, 5.0/3 mol of $Si_3N_4$, and 0.030 mol of $CeO_2$, so that the molar ratio of each element was set to be Sr:Al:Si :Ce=0.970:1:5:0.030, and the raw materials thus measured was mixed in the atmosphere by using the mortar. The raw materials thus mixed was put in the crucible, and the temperature was increased to 1800° C. at 15° C./min, with in-furnace pressure of 0.05 MPa, in a nitrogen atmosphere (flow state), and in this condition, the raw materials are retained and fired for 3 hours at 1800° C., then cooled from 1800° C. to 200° C. for 1 hour. Thereafter, a fired sample was pulverized in an atmospheric air to obtain a suitable particle size by using the mortar, and thus the phosphor of the example 2 expressed by the composition formula $Sr_3Al_3Si_{15}O_3N_{23}$:Ce (where Ce/(Sr+Ce)=0.030) was obtained. Note that this composition formula is a composition estimated by the raw material used and its blending ratio. An analysis result of the powdery phosphor thus obtained is shown in table 1.

The analysis result of the composition of the phosphor thus obtained was close to the theoretical value obtained from the atomic weight and the molar ratio of the constituent element in the same way as the example 1. The slight deviation is considered to be caused by the measurement error or the impurities mixed in during manufacturing the phosphor. The specific surface area was 0.302 $m^2/g$, or the primary particle size observed by the SEM diameter was about 12.3 μm, and the average particle size (D50) obtained by the laser Doppler measuring method was 16.85 μm, satisfying the range of not less than 1.0 μm and not more than 20.0 μm preferable as the phosphor.

chain line of FIG. 4, the excitation spectrum of the phosphor also, in the same way as the example 1, exhibits the yellow emission with high intensity by the excitation light with the broad wavelength region from 300 nm or around to 500 nm.

The example 2 shows the composition with a large molar ratio of Si and N, compared with that of the example 1, and shows an excellent emission characteristic in the same way as that of the example 1.

EXAMPLE 3

In the example 3, the phosphor of the example 3 was manufactured in the same way as the example 1, other than replacing Ce with Eu, as the activator, in the phosphor expressed by the composition formula $Sr_2Al_2Si_9O_2N_{14}$:Ce (where Ce/(Sr+Ce)=0.030) of the phosphor of the example 1. The molar ratio of each element was expressed by Sr:Al:Si:Eu=0.970:1:4.5:0.030, and each raw material was measured in 0.970 mol of $SrCO_3$, 1.0 mol of AlN, 4.5/3 mol of $Si_3N_4$, and 0.030/2 mol of $Eu_2O_3$. The composition estimated by the raw material used and its blending ratio is expressed by $Sr_2Al_2Si_9O_2N_{14}$:Eu (where Eu/(Sr 30 Eu)=0.030). In the same way as the example 1, the analysis result of the powdery phosphor thus obtained is shown in table 1.

TABLE 1

| | COMPOSITION FORMULA | z/(m + z) | Sr (wt %) | Al (wt %) | Si (wt %) | O (wt %) | N (wt %) | Ce (wt %) | Eu (wt %) | OTHERS (wt %) | AVERAGE PARTICLE SIZE (μm) | SPECIFIC SURFACE AREA ($m^2/g$) |
|---|---|---|---|---|---|---|---|---|---|---|---|---|
| EXAMPLE 1 | $Sr_2Al_2Si_9O_2N_{14}$:Ce | 0.030 | 24.8 | 7.07 | 32.2 | 2.25 | 30.5 | 1.23 | | 1.98 | 17.50 | 0.285 |
| EXAMPLE 2 | $Sr_3Al_3Si_{15}O_3N_{23}$:Ce | 0.030 | 23.7 | 6.11 | 33.6 | 2.11 | 30.5 | 1.10 | | 2.88 | 16.85 | 0.302 |
| EXAMPLE 3 | $Sr_2Al_2Si_9O_2N_{14}$:Eu | 0.030 | 24.5 | 7.13 | 32.3 | 1.83 | 28.1 | | 1.32 | 4.82 | 17.27 | 0.291 |

Next, the emission spectrum of the phosphor of the example 2 was measured. The measurement result was shown in table 2, and further described in FIG. 2 and FIG. 3.

One dot chain line of FIG. 2 shows the measurement result of the emission spectrum, when the phosphor is irradiated with the monochromatic light with the wavelength of 460 nm as the excitation light. The phosphor has the spectrum with a broad peak in the broad wavelength region from 470 nm to 770 nm, and the peak wavelength was 559.2 nm. In addition, the half value width obtained was 116.4 nm, and the chromaticity (x, y) of the emission spectrum obtained was x=0.4171 and y=0.5427. Note that the powder had a yellow fluorescent color, and a yellow emission color could be visually checked.

The measurement result of the emission spectrum when the phosphor was irradiated with the monochromatic light with the wavelength of 405 nm as the excitation light was shown by using the one dot chain line in table 2 and FIG. 3. The phosphor of the example 2 has a broad peak over the broad wavelength region from 470 nm to 770 nm in the excitation wavelength of 405 nm also, and the peak wavelength was 552.5 nm. Also, the half value width obtained was 118.0 nm, and the chromaticity (x, y) of the emission spectrum was x=0.3783 and y=0.5389. Note that the yellow fluorescent color could be visually checked.

The one dot chain line of FIG. 4 shows the excitation spectrum of the phosphor of the example 2. In this measurement, the phosphor of the example 2 was irradiated with the monochromatic light with the wavelength from 300 nm to 570 nm, and an excitation dependency of the emission intensity of the light with the wavelength of 559.2 nm emitted by the phosphor was measured. As obvious from the one dot The analysis result of the composition of the phosphor thus obtained was close to the theoretical value obtained by a molecular weight and the molar ratio of the constituent element. The specific surface area was 0.291 $m^2/g$, the primary particle size observed by the SEM diameter was about 13.1 μm, and the average particle size (D50) obtained by the Laser Doppler measuring method was 17.27 μm. Thus, in the case of using Eu as the activator, almost the same result as the case of using Ce as the activator could be obtained for the composition, the specific surface area, and the SEM diameter.

Next, the emission spectrum of the phosphor of the example 3 was measured. The measurement result is shown in table 2, and the emission spectra when the phosphor is irradiated with the light of the excitation wavelength Ex 460 nm and Ex 405 nm are further shown in FIG. 2 and FIG. 3, respectively.

Table 2 and two dot-line of FIG. 2 shows the measurement result of the emission spectrum when the phosphor is irradiated with the monochromatic light with the wavelength of 460 nm as the excitation light. It was found from the table 2 and the two dot-line of FIG. 2, that the phosphor at the excitation wavelength Ex 460 nm had a broad peak in the broad wavelength region from 470 nm to 770 nm, and the peak wavelength was 613.8 nm. In addition, the half value width obtained was 115.6 nm, and the chromaticity (x, y) of the emission spectrum obtained was x=0.5573, and y=0.4330. Further, the power had an orange color and an orange emission color could be visually checked.

In addition, table 2 and two dot-chain line of FIG. 3 shows the measurement result of the emission spectrum when the phosphor is irradiated with the monochromatic light with the wavelength of 405 nm as the excitation light. It was found from the table 2 and the two dot-line of FIG. 3, that the phosphor had the broad peak in the broad wavelength range from 470 nm to 770 nm, and the peak wavelength was 607.9 nm. In addition, the half value width obtained was 114.2 nm, and the chromaticity (x, y) of the emission spectrum obtained was x=0.5083, and y=0.4172. Further, an orange emission color could be visually checked.

The phosphor of the example 3 has the same matrix as the phosphor of the example 1. However, by replacing the activator Ce with Eu, the peak of the emission spectrum could be shifted (the peak wavelength is shifted from about 560 nm of Ce to about 610 nm of Eu) to the longer wavelength side, while substantially maintaining the emission intensity. In the silicon nitride-based phosphor and the sialon phosphor proposed heretofore, when the activator is replaced, although the peak wavelength is shifted, a problem involved therein is that the emission intensity is drastically decreased. However, the matrix of the example 3 is characterized by showing an excellent emission intensity in either activator Ce or Eu. Further, the phosphor of the example 3, with the peak wavelength being about 610 nm, exhibits an orange emission, and therefore offers promising prospects as the phosphor for the white LED illumination of bulb color. Further, the orange emitting phosphor proposed heretofore, in which the oxynitride and nitride are activated by Eu, does not exceed 100 nm in the half value width of the emission spectrum. However, the phosphor of the example 3 has a significantly broad emission spectrum, with half value width exceeding about 120 nm.

Figure 5:
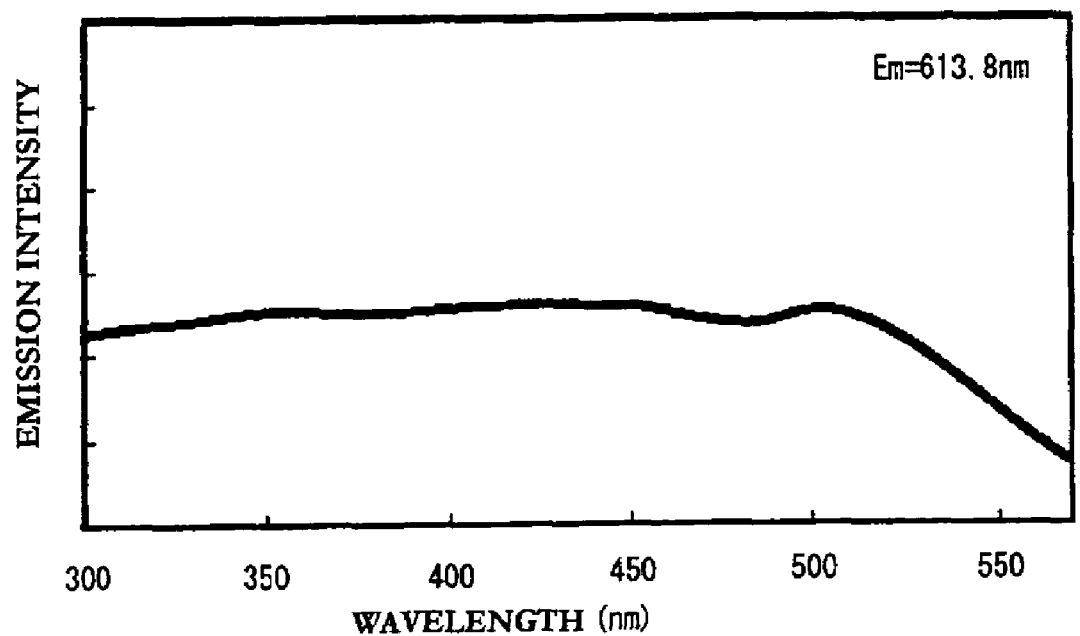
FIG. 5 is a graph showing the excitation spectrum of the phosphor of the example 3.

FIG. 5 shows an excitation spectrum of the phosphor of the example 3. Note that FIG. 5 shows the same graph as that of FIG. 4. In this measurement, the phosphor of the example 3 is irradiated with the monochromatic light in the wavelength range from 300 nm to 570 nm, and the dependency of the emission intensity of the light with the wavelength of 613.8 nm emitted by the phosphor on the wavelength of the excitation light was measured. Then, it was found from the excitation spectrum of the phosphor, that this phosphor emitted light of an orange color with high intensity by excited by the excitation light with a broad wavelength range from 300 nm or around to 550 nm. Further, as a result of measuring the emission intensity when the phosphor was irradiated with the excitation light of monochromatic color in the wavelength range from 350 nm to 500 nm, when the emission intensity in the excitation wavelength, where the intensity of the spectrum absorbing and emitting the excitation light having the aforementioned wavelength became largest, was set at $P_H$, and the emission intensity of the excitation wavelength, where the emission intensity became smallest, was set at $P_1$, the relation was expressed to satisfy $(P_H-P_1)/P_H \leq 0.10$. Namely, variation in the emission intensity when using the monochromatic light in the wavelength range from 350 nm to 500 nm was 10.0% or less, thereby showing a flat excitation band.

At present, although the yellow phosphor (YAG :Ce) used as the phosphor for the white LED illumination has the excitation band with highest efficiency near the wavelength of 460 nm, it does not have the excitation band with good efficiency over the broad range. Therefore, by dispersion of emission wavelengths due to the dispersion of emission elements on manufacturing the blue LED, the emission wavelength of the blue LED is out of an optimal excitation range of a YAG :Ce based yellow phosphor. This causes a lost of balance in the emission intensity of blue color and yellow color, and the color tone of the white light is changed. Meanwhile, the phosphor of the example 3 has a flat excitation band, and therefore an approximately constant emission intensity is obtained, even when the dispersion of the emission wavelengths of the emission elements occurs. This makes it possible to manufacture the white LED illumination having a stable same color tone, and therefore the phosphor of the example 3 has an advantage in both quality and manufacturing cost.

COMPARATIVE EXAMPLE 1

The phosphor expressed by the composition formula $Sr_2Si_5N_8$:Ce (where Ce/(Sr+Ce)=0.030) was manufactured and defined as a comparative example 1.

The comparative example 1 was manufactured in the following way.

The commercially available samples $Sr_3N_2$(2N), $Si_3N_4$ (3N), $CeO_2$(3N) were prepared as raw materials, and each raw material was measured in 1.94/3 mol of $Sr_3N_2$, 5.0/3 mold $Si_3N_4$, and 0.060 mol of $CeO_2$ were weighed and mixed in a glove box under a nitrogen atmosphere by using the mortar, so that the molar ratio of each element was expressed, satisfying Sr:Si :Ce=1.94:5.0:0.06. As per the manufacturing method as will be described hereunder, the firing temperature was set to be 1600° C. Other than the firing temperature which was set to be 1600° C., a phosphor sample was manufactured in the same way as the example 1.

Next, in the same way as the example 1, the emission spectrum of the phosphor of the comparative example 1 was measured. The measurement result is shown in table 2 and FIG. 2 and FIG. 3 (long broken line). As clearly shown from the long broken line of FIG. 2 and FIG. 3, the phosphor of the comparative example 1 showed a broad emission spectrum. Also, as shown in the long broken line of FIG. 2, when the phosphor was excited by the light with the wavelength of 460 nm, it showed the emission spectrum with a peak in the wavelength of 557.2 nm, the relative intensity of the emission intensity was 28.5% when the relative intensity of the example 1 was defined as 100%, and the relative intensity of the luminance was 32.6%. In the chromaticity of the emission spectrum (x, y), x=0.3716 and y=0.5080. In addition, as shown by the long broken line of FIG. 3, the phosphor of the comparative example 1 showed the emission spectrum with a peak in the wavelength of 562.0 nm when excited by the light of the excitation wavelength of 405 nm, the relative intensity of the emission intensity was 56.4% when the relative intensity of the example 1 was defined as 100%, and the relative intensity of the luminance was 62.1%. In the chromaticity (x, y) of the emission spectrum, x=0.3901 and y=0.4985. In addition, a green color emission could be visually checked.

COMPARATIVE EXAMPLE 2

The phosphor expressed by the composition formula $Sr_{1.5}Al_3Si_9N_{26}$:Ce (where Ce/(Sr+Ce)=0.030) was manufactured and defined as a comparative example 2.

The comparative example 2 was manufactured in the following way.

The commercially available samples $Sr_3N_2$(2N), AlN(3N), $Si_3N_4$(3N), and $CeO_2$(3N) were prepared as raw materials, and each raw material was measured in 1.455/3 mol of $Sr_3N_2$, 3.0 mol of AlN, 9.0/3 mol of $Si_3N_4$, and 0.045 mol of $CeO_2$ were weighed and mixed in the glove box under the nitrogen atmosphere. Other than the firing temperature which was set to be 1700° C., a phosphor sample was manufactured in the same way as the example 1.

Next, in the same way as the example 1, the emission spectrum of the phosphor of the comparative example 2 was measured. The measurement result is shown by a short broken line in table 2, FIG. 2, and FIG. 3. As clearly shown from the short broken line of FIG. 2 and FIG. 3, the phosphor of the comparative example 2 showed a broad emission spectrum. In addition, as shown by the short broken line of FIG. 2, the emission spectrum with a peak in the wavelength of 560.8 nm was exhibited when the phosphor was excited by the light with the wavelength of 460 nm, the relative intensity of the emission intensity was 16.0% when the relative intensity of the example 1 was set to 100%, and the relative intensity of the luminance was 16.7%. The chromaticity (x, y) of the emission spectrum was x=0.3992, and y=0.5116. Further, as shown by the short broken line of FIG. 3, the phosphor of the comparative example 2 showed the emission spectrum with a peak in the wavelength of 527.5 nm when excited by the monochromatic light of 405 nm, and when the relative intensity of the example 1 was set to 100%, the relative intensity of the emission intensity was 20.9%, and the relative intensity of the luminance was 22.2%. The chromaticity (x, y) of the emission spectrum was x=0.3316 and y=0.4958. In addition, the emission of yellow color was visually checked when the phosphor was excited by the light of the wavelength of 460 nm, and the emission of green color was checked when the phosphor was excited by the light of the wavelength of 405 nm.

COMPARATIVE EXAMPLE 3

The phosphor expressed by the composition formula $SrAl_2SiO_3N_2:Ce$ (Where Ce/(Sr+Ce)=0.030) described in the patent document 3 was manufactured and defined as a comparative example 3.

The phosphor of the comparative example 3 was manufactured as follows.

The commercially available samples $SrCO_3$(3N), AlN (3N), $SiO_2$(3N), $CeO_2$(3N) were prepared as the raw materials, and each raw material was weighed in 0.970 mol of $SrCO_3$, 2.0 mol of AlN, 1.0 mol of $SiO_2$, and 0.030 mol of $CeO_2$, so that the molar ratio of each element was Sr:Al:Si :Ce=0.970:2.0:1.0:0.030, and mixed in the atmospheric air by using the mortar. As for the manufacturing method, the phosphor was manufactured in the same way as the example 1, except that the firing temperature was set at 1400° C.

Next, in the same way as the example 1, the emission spectrum of the phosphor of the comparative example 3 was measured, and it was found that the phosphor did not emit light when excited by the lights with the wavelength of 460 nm and 405 nm, thus making it impossible to measure. However, when the phosphor was irradiated with the excitation light with the wavelength of 254 nm and 360 nm, the light emission of blue color could be visually checked.

Further, when fired at the firing temperature of 1800° C., the raw material was melted.

<Study on the Examples 1, 2, 3, and the Comparative Examples 1, 2, 3>

As clearly shown in the composition formula of table 2, the phosphors of the example 1, example 2, and example 3 having new compositions are different from the comparative example 1 and include Al in the constituent element, have the composition formula different from that of the sialon phosphor of the comparative example 2 (sialon composition formula $M_x(Al, Si)_{12}(O, N)_{16}$, $0<x \leq 1.5$), and are different from the comparative example 3 and take a larger molar ratio of nitrogen than that of oxygen.

As clearly shown from the result of FIG. 2 and FIG. 3, the phosphors of the example 1, example 2, and example 3 show not less than 3 times emission intensity and not less than 2.5 times luminance, when excited by the light with the wavelength of 460 nm, compared with the phosphors of the comparative examples 1 to 3, and when excited by the light with the wavelength of 405 nm, show not less than 1.5 times emission intensity and luminance. Thus, it was found that the aforementioned phosphors exhibited high efficient phosphors showing higher emission intensity and luminance compared with the conventional phosphor.

TABLE 2

| | COMPOSITION FORMULA | z/(m + z) | FIRING CONDITION | EXCITATION WAVE-LENGTH (nm) | EMISSION INTENSITY (%) | LUMI-NANCE (%) | PEAK WAVE-LENGTH (nm) | CHROMATICITY x | y |
|---|---|---|---|---|---|---|---|---|---|
| EXAMPLE 1 | $Sr_2Al_2Si_9O_2N_{14}$:Ce | 0.030 | 1800° C. × 3 h, $N_2$ ATMOSPHERE | 460 | 100.0 | 100.0 | 559.3 | 0.4156 | 0.5434 |
| EXAMPLE 2 | $Sr_3Al_3Si_{15}O_3N_{23}$:Ce | 0.030 | 1800° C. × 3 h, $N_2$ ATMOSPHERE | 460 | 96.3 | 95.7 | 559.2 | 0.4171 | 0.5427 |
| EXAMPLE 3 | $Sr_2Al_2Si_9O_2N_{14}$:Eu | 0.030 | 1800° C. × 3 h, $N_2$ ATMOSPHERE | 460 | 96.9 | 77.2 | 613.8 | 0.5573 | 0.4330 |
| COMPARATIVE EXAMPLE 1 | $Sr_2Si_5N_8$:Ce | 0.030 | 1600° C. × 3 h, $N_2$ ATMOSPHERE | 460 | 28.5 | 32.6 | 557.2 | 0.3716 | 0.5080 |
| COMPARATIVE EXAMPLE 2 | $Sr_{1.5}Al_3Si_9N_{16}$:Ce | 0.030 | 1700° C. × 3 h, $N_2$ ATMOSPHERE | 460 | 16.0 | 16.7 | 560.8 | 0.3992 | 0.5116 |
| COMPARATIVE EXAMPLE 3 | $SrAl_2SiO_3N_2$:Ce | 0.030 | 1400° C. × 3 h, $N_2$ ATMOSPHERE | 460 | INCAPABLE MEASUREMENT | | | | |
| EXAMPLE 1 | $Sr_2Al_2Si_9O_2N_{14}$:Ce | 0.030 | 1800° C. × 3 h, $N_2$ ATMOSPHERE | 405 | 108.1 | 111.8 | 552.3 | 0.3730 | 0.5377 |
| EXAMPLE 2 | $Sr_2Al_2Si_{10}O_2N_{14}$:Ce | 0.030 | 1800° C. × 3 h, $N_2$ ATMOSPHERE | 405 | 103.7 | 106.5 | 552.5 | 0.3783 | 0.5389 |
| EXAMPLE 3 | $Sr_2Al_2Si_9O_2N_{14}$:Eu | 0.030 | 1800° C. × 3 h, $N_2$ ATMOSPHERE | 405 | 98.9 | 88.6 | 607.9 | 0.5083 | 0.4172 |
| COMPARATIVE EXAMPLE 1 | $Sr_2Si_5N_8$:Ce | 0.030 | 1600° C. × 3 h, $N_2$ ATMOSPHERE | 405 | 56.4 | 62.1 | 562.0 | 0.3901 | 0.4985 |
| COMPARATIVE EXAMPLE 2 | $Sr_{1.5}Al_3Si_9N_{16}$:Ce | 0.030 | 1700° C. × 3 h, $N_2$ ATMOSPHERE | 405 | 20.9 | 22.2 | 527.5 | 0.3316 | 0.4958 |
| COMPARATIVE EXAMPLE 3 | $SrAl_2SiO_3N_2$:Ce | 0.030 | 1400° C. × 3 h, $N_2$ ATMOSPHERE | 405 | INCAPABLE MEASUREMENT | | | | |

EXAMPLE 4 TO EXAMPLE 13

Study on Ce Activation Amount

In the example 4 to the example 13, change in the emission intensity and luminance of the phosphor expressed by the composition formula $Sr_2Al_2Si_9O_2N_{14}$:Ce was measured when the concentration of the element Z(Ce), which is an activator, was changed. Here, in manufacturing a measurement sample, the mixing ratio of the raw materials was adjusted, so that the relation between Ce and Sr, which are activators, is m+z=1. Then, as explained in the example 1, the mixing ratio of each raw material of $SrCO_3$(3N), AlN(3N), $Si_3N_4$(3N), $CeO_2$(3N) was adjusted, and a phosphor sample was manufactured in the same way as the example 1, excepting that Ce-activated concentration was changed, and the emission intensity and luminance thus manufactured were measured. Wherein the Ce-activated concentration Ce/(Sr+Ce) was selected to be 0.001 (example 4), 0.005 (example 5), 0.010 (example 6), 0.020 (example 7), 0.025 (example 8), 0.030 (example 9), 0.035 (example10), 0.040 (example11), 0.050 (example12), and 0.100 (example 13).

Figure 6:
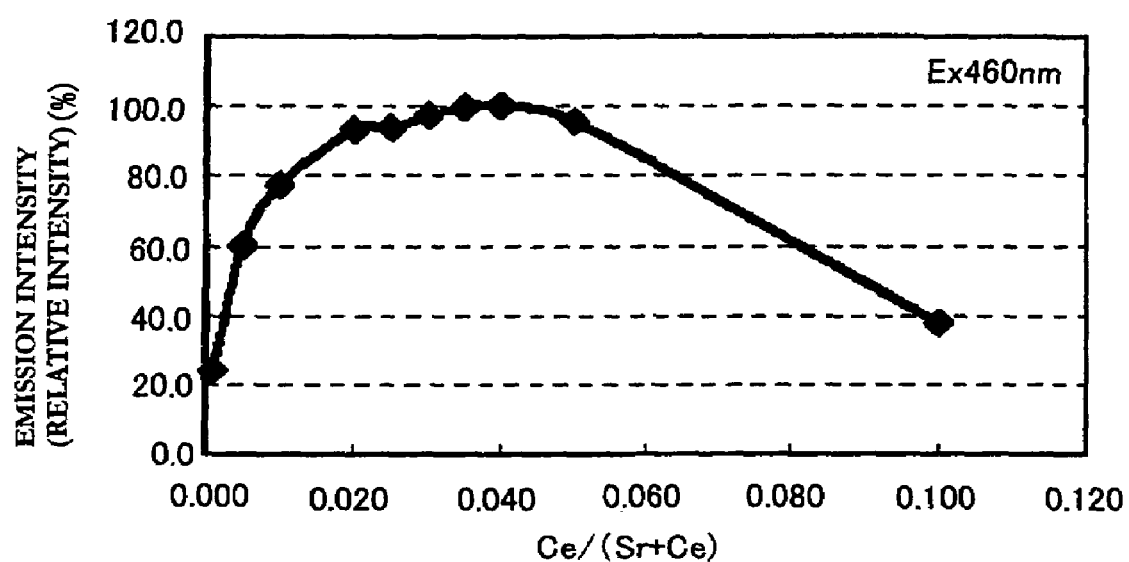
FIG. 6 is a graph showing the relation between a concentration of an activator Z (Ce) and the emission intensity in the phosphors of the examples 4 to 13.

The result thus measured is shown in table 3 and FIG. 6. FIG. 6 is a graph in which the relative intensity of the emission intensity of each of the phosphor samples is taken on the ordinate axis, and the value of the mixing ratio Ce/(Sr+Ce) of Sr and Ce is taken on the abscissa axis. As for the emission intensity and luminance, the value of the emission intensity in the peak wavelength of Ce/(Sr+Ce)=0.040 (example 11) was set to be 100%. The light with the wavelength of 460 nm was used as the excitation light.

As clearly shown in the result of table 3 and FIG. 6, in the region where the value of Ce/(Sr+Ce) is small, the emission intensity and luminance are increased in association with the increase in the value of Ce/(Sr+Ce). However, the emission intensity and luminance are decreased in association with the increase in the value of Ce/(Sr+Ce), with the vicinity of Ce/(Sr+Ce)=0.040 as a peak. This is because an activator element is insufficient in a part where the value is smaller than Ce/(Sr+Ce)=0.040, and concentration quenching due to the activator element is observed in a part where the value is larger than Ce/(Sr+Ce)=0.040.

Meanwhile, as clearly shown in the result of table 3, in association with the increase in the value of Ce/(Sr+Ce), it was confirmed that the value of the peak wavelength was shifted to the longer wavelength side, if the data of Ce /(Sr+Ce)=0.001 was excepted.

Along with the measurement of the emission intensity and luminance, the chromaticity (x, y) of the emission spectrum was measured, and the result is shown in table 3.

TABLE 3

| | COMPOSITION FORMULA | Ce/(Sr + Ce) | EXCITATION WAVELENGTH (nm) | EMISSION INTENSITY (%) | LUMINANCE (%) | PEAK WAVELENGTH (nm) | CHROMATICITY x | y |
|---|---|---|---|---|---|---|---|---|
| EXAMPLE 4 | $Sr_2Al_2Si_9O_2N_{14}$:Ce | 0.001 | 460 | 24.5 | 25.7 | 564.9 | 0.4172 | 0.5299 |
| EXAMPLE 5 | | 0.005 | 460 | 60.1 | 61.8 | 557.7 | 0.4060 | 0.5451 |
| EXAMPLE 6 | | 0.010 | 460 | 77.4 | 79.0 | 559.2 | 0.4078 | 0.5465 |
| EXAMPLE 7 | | 0.020 | 460 | 93.2 | 94.3 | 559.2 | 0.4133 | 0.5462 |
| EXAMPLE 8 | | 0.025 | 460 | 93.7 | 94.9 | 559.7 | 0.4141 | 0.5456 |
| EXAMPLE 9 | | 0.030 | 460 | 97.2 | 98.2 | 559.7 | 0.4161 | 0.5449 |
| EXAMPLE 10 | | 0.035 | 460 | 99.4 | 100.4 | 561.4 | 0.4163 | 0.5422 |
| EXAMPLE 11 | | 0.040 | 460 | 100.0 | 100.0 | 561.2 | 0.4225 | 0.5432 |
| EXAMPLE 12 | | 0.050 | 460 | 95.6 | 95.6 | 561.6 | 0.4271 | 0.5401 |
| EXAMPLE 13 | | 0.100 | 460 | 38.1 | 38.9 | 564.8 | 0.4413 | 0.5284 |

EXAMPLE 14 TO EXAMPLE 23

Study On the Amount of Activator Eu

In the examples 14 to example 23, the emission intensity and luminance when the concentration of the activator element Z(Eu) was changed was measured, in the phosphor expressed by the composition formula $Sr_2Al_2Si_9O_2N_{14}$:Eu. Here, in the manufacture of the measurement sample, in the same way as the examples 4 to 13, the mixing ratio of the raw materials was adjusted, so that the relation between Eu and Sr, which are activators, was m+z=1. Then, each raw material of $SrCO_3$(3N), AlN(3N), $Si_3N_4$(3N), $Eu_2O_3$(3N) explained in the example 3 was adjusted, and in the same way as the example 3, the phosphor sample was manufactured excepting that the Eu activator concentration was changed, and the emission intensity and luminance of the phosphor thus manufactured were measured. Wherein, the Eu activator concentration Eu/(Sr+Eu) was set to be 0.001 (example 14), 0.005 (example 15), 0.010 (example 16), 0.020 (example 17), 0.025 (example 18), 0.030 (example 19), 0.035 (example 20), 0.040 (example 21), 0.050 (example 22), 0.100 (example 23).

(0112)

Figure 7:
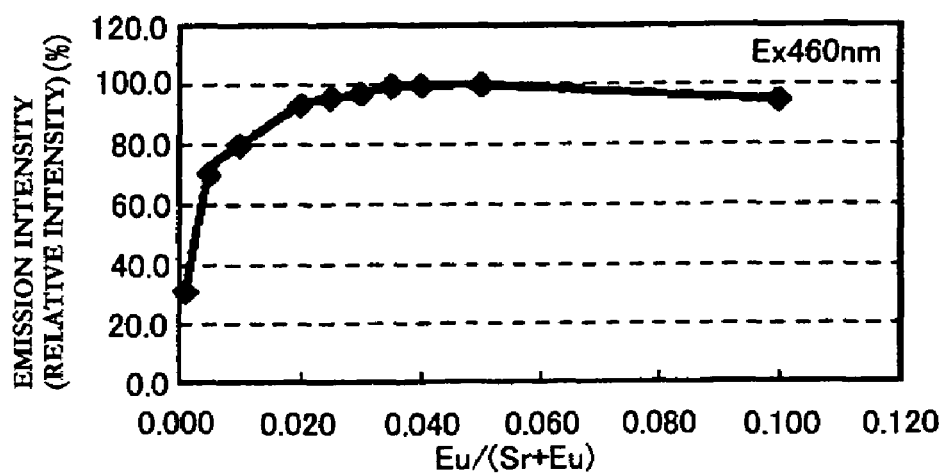
FIG. 7 is a graph showing the relation between the concentration of the activator Z (Eu) and the emission intensity in the phosphors of the examples 14 to 23.

The measurement result is shown in table 4 and FIG. 7. Here, FIG. 7 is a graph showing the relative intensity of the emission intensity of each phosphor sample taken on the ordinate axis, and the value of the blending ratio Eu/(Sr+Eu) of Sr and Eu taken on the abscissa axis. Wherein, as for the emission intensity and luminance, the value of the emission intensity in the peak wavelength of Eu/(Sr+Eu)=0.050 (example 22) was defined as 100%. In addition, the light with the wavelength of 460 nm was used as the excitation light.

(0113)

As clearly shown in table 4 and FIG. 7, in the region where the value of Eu/(Sr+Eu) is small, the emission intensity and luminance are increased along with the increase of the value of Eu/(Sr+Eu). However, the emission intensity and luminance are decreased, along with the increase of the value of Eu/(Sr+Eu), with a peak in the vicinity of Eu/(Sr+Eu)=0.050. This is because the activator element is insufficient in a part where the value of the Eu/(Sr+Eu) is smaller than Eu/(Sr+Eu)

=0.050, thereby causing the concentration quenching due to the activator element to occur in a part where the value of the Eu/(Sr+Eu) is larger than Eu/(Sr+Eu)=0.050. However, loose decrease of the emission intensity due to the concentration quenching is observed in a region where the activator concentration is high, compared with the case of the Ce activator concentration of the examples 4 to 13. It appears that this is caused by a difference of the ion radius and the difference of the valency between Eu and Ce.

Meanwhile, as clearly shown from the result of the table 4, it was confirmed that the value of the peak wavelength was shifted toward the longer wavelength side along with the increase of the value of Eu/(Sr+Eu), when the data of Eu/(Sr+Eu)=0.001 (example 14) and Eu/(Sr+Eu)=0.050 (example 22) were excepted.

In addition, in parallel to the measurement of the emission intensity and luminance, the chromaticity (x, y) of the emission spectrum was measured. The result is shown in table 4.

Al/Sr=0.75 (example 25), Al/Sr=0.90 (example 26), Al/Sr=1.00 (example 27), Al/Sr=1.10 (example28), Al/Sr=1.25 (example29), Al/Sr=1.50 (example 30), Al/Sr=2.00 (example 31), and Al/Sr=3.00 (example 32).

(0115)

Figure 8:
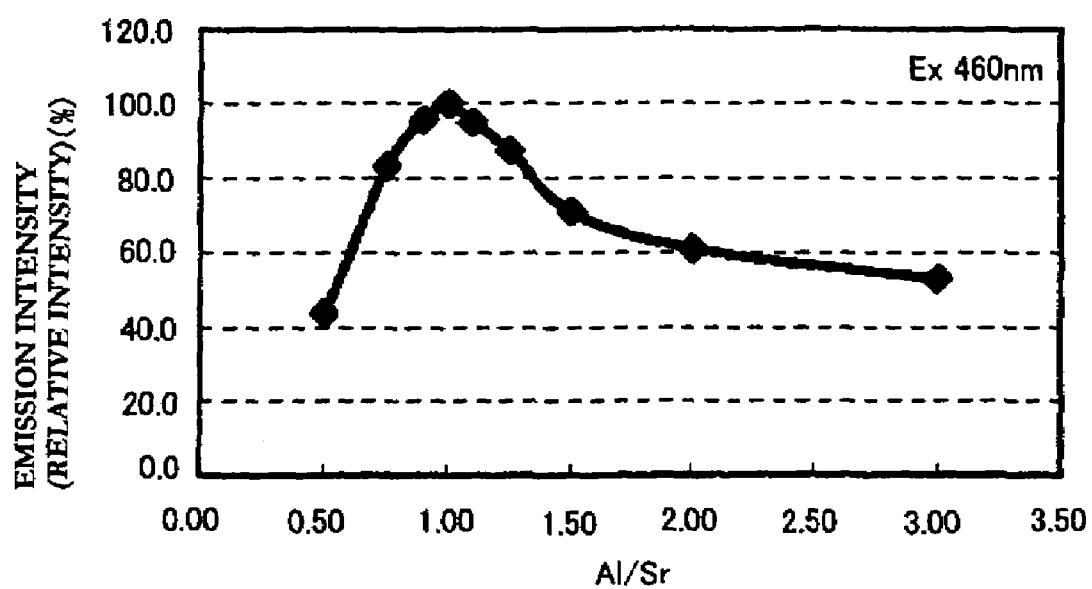
FIG. 8 is a graph showing the relation between Al/Sr ratio and the emission intensity in the phosphors of the examples 24 to 32.

The measurement result is shown in table 5 and FIG. 8. Here, FIG. 8 is a graph showing the relative intensity of the emission intensity of each phosphor sample taken on the ordinate axis, and the value of the blending ratio Al/Sr of Sr and Al taken on the abscissa axis. With regards to the emission intensity and luminance, the value of the emission intensity in the peak wavelength of Al/Sr=1.0 (example 27) was defined as 100%. The value of Al/Sr was adjusted at 0.50 to 3.00, and the result is shown. The light with the wavelength of 460 nm was used as the excitation light.

TABLE 4

| COMPOSITION | | EXCITATION WAVELENGTH | EMISSION INTENSITY | LUMINANCE | PEAK WAVELENGTH | CHROMATICITY | |
|---|---|---|---|---|---|---|---|
| FORMULA | Eu/(Sr + Eu) | (nm) | (%) | (%) | (nm) | x | y |
| EXAMPLE 14 $Sr_2Al_2Si_9O_2N_{14}$:Eu | 0.001 | 460 | 31.0 | 44.3 | 588.3 | 0.4853 | 0.4755 |
| EXAMPLE 15 | 0.005 | 460 | 70.2 | 85.1 | 504.6 | 0.5261 | 0.4558 |
| EXAMPLE 16 | 0.010 | 460 | 79.8 | 93.6 | 505.2 | 0.5338 | 0.4515 |
| EXAMPLE 17 | 0.020 | 460 | 93.2 | 99.0 | 611.3 | 0.5514 | 0.4382 |
| EXAMPLE 18 | 0.025 | 460 | 95.5 | 100.0 | 611.1 | 0.5537 | 0.4368 |
| EXAMPLE 19 | 0.030 | 460 | 97.2 | 96.7 | 615.2 | 0.5611 | 0.4296 |
| EXAMPLE 20 | 0.035 | 460 | 99.6 | 96.6 | 615.2 | 0.5659 | 0.4264 |
| EXAMPLE 21 | 0.040 | 460 | 99.7 | 94.2 | 615.3 | 0.5695 | 0.4231 |
| EXAMPLE 22 | 0.050 | 460 | 100.0 | 100.0 | 610.7 | 0.5616 | 0.4299 |
| EXAMPLE 23 | 0.100 | 460 | 94.7 | 69.9 | 626.5 | 0.5986 | 0.3951 |

EXAMPLE 24 TO EXAMPLE 25

Change of Al/Sr Ratio

In the example 24 to example 32, with regards to the phosphor expressed by the composition formula $Sr_2Al_aSi_9O_2N_n$:Ce(Ce/(Sr+Ce)=0.030, n=2/3 m+a+4/3 b−2/3 o, m=2.0, b=9.0, o=2.0), the molar ratio of Sr, Si, o is fixed to 2, 9, 2, respectively, and the change of the emission intensity and luminance was measured when the a/m ratio (here, a/m and Al/Sr have the same meaning) was changed. Here, in the manufacture of the measurement sample, the phosphor sample was manufactured in the same way as the example 1, excepting that the mixing ratio of only AlN(3N) out of each raw material of $SrCO_3$(3N), AlN(3N), $Si_3N_4$(3N), $CeO_2$(3N) explained in the example 1 was adjusted, and the emission intensity and luminance of the phosphor thus manufactured were measured. Wherein, the blending ratio of Al and Sr thus adjusted was set to be Al/Sr=0.50 (example 24), (0116)

As being clarified from the result of table 5 and FIG. 8, the emission intensity and luminance are increased along with the increase of the value in the region where the value of Al/Sr is small. However the emission intensity and luminance are decreased, with a peak in the vicinity of Al/Sr=1.0 (example 27).

This is because when the value of Al/Sr is largely deviated from Al/Sr=1.0, an unreacted raw material is remained in the phosphor after firing, the phase different from a light emitting phase is generated, and the crystallinity of the matrix structure of the phosphor is deteriorated because the X-ray diffraction peak intensity is reduced when Al/Sr is not less than 1.0, and further the structure suitable for light emission is collapsed, to generate the impurity phase not contributing to the light emission. Thus, when the value of Al/Sr is deviated from Al/Sr=1.0, the emission intensity and luminance are deteriorated. However, if such a deviation is small, the influence is also small, and when the Al/Sr is in the range of 0.8≦Al/Sr≦1.2, 80% or more value of the emission intensity and luminance of Al/Sr=1.0 is exhibited.

TABLE 5

| COMPOSITION | Ce/ | | EXCITATION WAVELENGTH | EMISSION INTENSITY | LUMINANCE | PEAK WAVELENGTH | CHROMATICITY | |
|---|---|---|---|---|---|---|---|---|
| FORMULA | (Sr + Ce) | Al/Sr | (nm) | (%) | (%) | (nm) | x | y |
| EXAMPLE 24 $Sr_2Al_{1.0}Si_9O_2N_{13.0}$:Ce | 0.030 | 0.50 | 460 | 43.8 | 44.4 | 562.4 | 0.4207 | 0.5293 |
| EXAMPLE 25 $Sr_2Al_{1.5}Si_9O_2N_{13.5}$:Ce | 0.030 | 0.75 | 460 | 82.9 | 83.3 | 562.1 | 0.4207 | 0.5369 |
| EXAMPLE 26 $Sr_2Al_{1.8}Si_9O_2N_{13.8}$:Ce | 0.030 | 0.90 | 460 | 95.4 | 95.4 | 561.6 | 0.4178 | 0.5406 |
| EXAMPLE 27 $Sr_2Al_{2.0}Si_9O_2N_{14.0}$:Ce | 0.030 | 1.00 | 460 | 100.0 | 100.0 | 559.3 | 0.4156 | 0.5434 |

TABLE 5-continued

| | COMPOSITION FORMULA | Ce/ (Sr + Ce) | Al/Sr | EXCITATION WAVELENGTH (nm) | EMISSION INTENSITY (%) | LUMINANCE (%) | PEAK WAVELENGTH (nm) | CHROMATICITY x | y |
|---|---|---|---|---|---|---|---|---|---|
| EXAMPLE 28 | $Sr_2Al_{2.2}Si_9O_2N_{14.2}$:Ce | 0.030 | 1.10 | 460 | 94.8 | 102.4 | 559.2 | 0.4130 | 0.5449 |
| EXAMPLE 29 | $Sr_2Al_{2.5}Si_9O_2N_{14.5}$:Ce | 0.030 | 1.25 | 460 | 87.2 | 94.6 | 559.2 | 0.4107 | 0.5448 |
| EXAMPLE 30 | $Sr_2Al_{3.0}Si_9O_2N_{15.0}$:Ce | 0.030 | 1.50 | 460 | 70.9 | 76.9 | 559.7 | 0.4114 | 0.5419 |
| EXAMPLE 31 | $Sr_2Al_{4.0}Si_9O_2N_{16.0}$:Ce | 0.030 | 2.00 | 460 | 61.0 | 66.3 | 559.7 | 0.4114 | 0.5403 |
| EXAMPLE 32 | $Sr_2Al_{6.0}Si_9O_2N_{18.0}$:Ce | 0.030 | 3.00 | 460 | 53.1 | 53.3 | 557.5 | 0.4043 | 0.5382 |

(0117)

EXAMPLES 33 TO 42

Change of Si/Sr

In the examples 33 to 42, the molar ratio of Sr, Al, O is fixed to 2, 2, 2, respectively in the phosphor expressed by the composition formula $Sr_2Al_2Si_bO_2N_n$:$Ce_{0.060}$ (Ce/(Sr+Ce)=0.030, n=2/3 m+a+4/3 b−2/3 o, wherein m=2.0, a=2.0, o=2.0), and the change of the emission intensity and luminance were measured when the b/m ratio (here, b/m and Si/Sr have the same meaning.) was changed. Here, in the manufacture of the measurement sample, the phosphor sample was manufactured in the same way as the example 1, excepting that the mixing ratio of only $Si_3N_4$(3N) out of each raw material of $SrCO_3$(3N), AlN(3N), $Si_3N_4$(3N), $CeO_2$(3N) explained in the example 1 was adjusted, and the emission intensity and luminance of the phosphor thus manufactured were measured. Wherein the blending ratio of Si and Sr was set to be Si/Sr=1.0 (example 33), Si/Sr=1.5 (example 34), Si/Sr=2.0 (example 35), Si/Sr=3.0 (example 36), Si/Sr=4.0 (example 37), Si/Sr=4.5 (example 38), Si/Sr=5.0 (example 39), Si/Sr=5.5 (example 40), Si/Sr=6.0 (example 41), Si/Sr=7.0 (example 42).

(0118)

Figure 9:
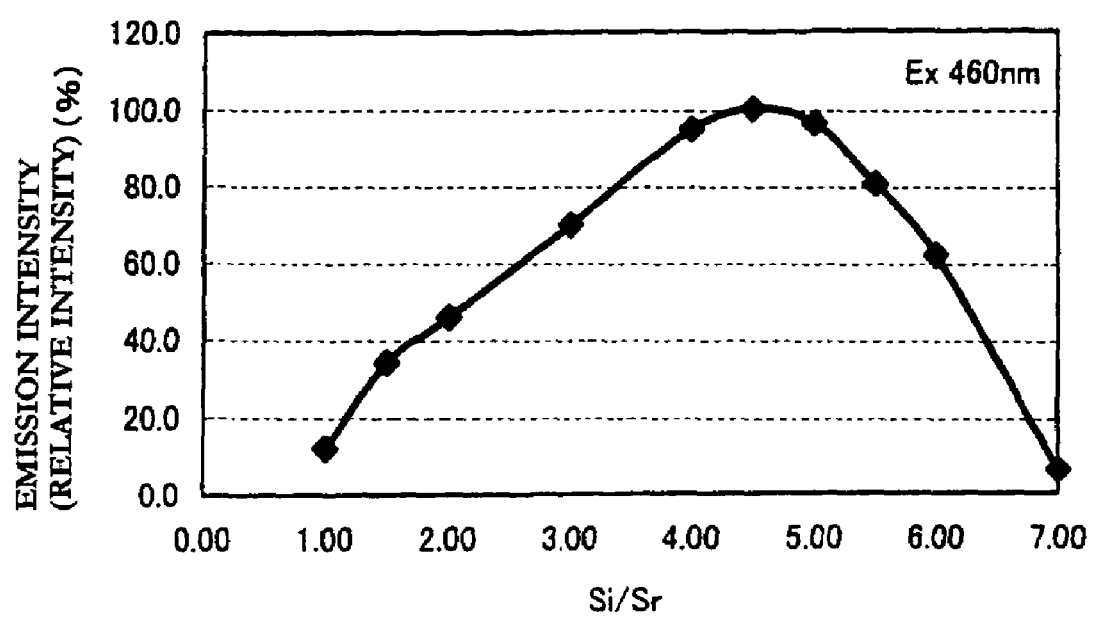
FIG. 9 is a graph showing the relation between Si/Sr ratio and the emission intensity in the phosphors of the examples 33 to 42.

The measurement result will be explained with reference to table 6 and FIG. 9. Here, FIG. 9 shows the relative intensity of the emission intensity of the phosphor sample taken on the ordinate axis, and the value of the blending ratio Si/Sr of Sr and Si taken on the abscissa axis. With regards to the emission intensity and luminance, the value of the emission intensity in the peak wavelength of Si/Sr=4.5 (example 38) was defined as 100%. The value of Si/Sr is adjusted to 1.0 to 7.0, and the result is shown. The light with the wavelength of 460 nm was used as the excitation light.

(0119)

As being clarified from the result of FIG. 9, the emission intensity was increased along with the increase of the value of Si/Sr in the region where the value of Si/Sr was small, with a peak at Si/Sr=4.5 (example 38), and when the value of Si/Sr exceeds Si/Sr=4.5, the emission intensity was deteriorated. This is because, in the same way as explained for Al/Sr in the examples 24 to 32, when the value of Si/Sr is largely deviated from Si/Sr=4.5, an unreacted raw material is remained in the phosphor after firing, the impurity phase is generated, and the crystallinity of the matrix structure of the phosphor is deteriorated because the X-ray diffraction peak intensity is reduced, and further the structure suitable for light emission is collapsed. Particularly, when the value of Si/Sr is selected to be smaller than 4.5, the peak observed on the lower angle side disappears, and a new peak is confirmed to appear. Meanwhile, when the value of Si/Sr is selected to be larger than 4.5, the peak observed on the lower angle side is confirmed to disappear. This reveals that when the value of Si/Sr is largely deviated from the relation of Si/Sr=4.5, the impurity phase not contributing to the light emission is generated. However, if the deviation is small, the influence is also small, and when the value of Si/Sr is in the range of $3.5 \leq Si/Sr \leq 6.0$, 80% or more value of the emission intensity and luminance of Si/Sr=4.5 is exhibited.

(0120)

EXAMPLE 43 TO EXAMPLE 50

Change of Sr Molar Ratio

With regards to the phosphor expressed by the composition formula $Sr_mAl_2Si_9O_2N_n$:Ce(Ce/(Sr+Ce)=0.030, n=2/3 m+a+

TABLE 6

| | COMPOSITION FORMULA | Ce/ (Sr + Ce) | Si/Sr | EXCITATION WAVELENGTH (nm) | EMISSION INTENSITY (%) | LUMINANCE (%) | PEAK WAVELENGTH (nm) | CHROMATICITY x | y |
|---|---|---|---|---|---|---|---|---|---|
| EXAMPLE 33 | $Sr_2Al_2Si_2O_2N_{4.67}$:Ce | 0.030 | 1.00 | 460 | 12.2 | 13.2 | 568.1 | 0.4130 | 0.4954 |
| EXAMPLE 34 | $Sr_2Al_2Si_3O_2N_{6.00}$:Ce | 0.030 | 1.50 | 460 | 34.2 | 36.6 | 566.2 | 0.4230 | 0.5163 |
| EXAMPLE 35 | $Sr_2Al_2Si_4O_2N_{7.33}$:Ce | 0.030 | 2.00 | 460 | 45.8 | 49.4 | 564.8 | 0.4165 | 0.5239 |
| EXAMPLE 36 | $Sr_2Al_2Si_6O_2N_{10.00}$:Ce | 0.030 | 3.00 | 460 | 69.8 | 74.8 | 560.7 | 0.4050 | 0.5355 |
| EXAMPLE 37 | $Sr_2Al_2Si_8O_2N_{12.67}$:Ce | 0.030 | 4.00 | 460 | 94.7 | 96.2 | 559.0 | 0.4088 | 0.5432 |
| EXAMPLE 38 | $Sr_2Al_2Si_9O_2N_{14.00}$:Ce | 0.030 | 4.50 | 460 | 100.0 | 100.0 | 559.3 | 0.4156 | 0.5434 |
| EXAMPLE 39 | $Sr_2Al_2Si_{10}O_2N_{15.33}$:Ce | 0.030 | 5.00 | 460 | 96.3 | 95.7 | 559.2 | 0.4171 | 0.5427 |
| EXAMPLE 40 | $Sr_2Al_2Si_{11}O_2N_{16.67}$:Ce | 0.030 | 5.50 | 460 | 80.2 | 86.2 | 559.7 | 0.4187 | 0.5413 |
| EXAMPLE 41 | $Sr_2Al_2Si_{12}O_2N_{18.00}$:Ce | 0.030 | 6.00 | 460 | 61.6 | 61.0 | 562.3 | 0.4237 | 0.5337 |
| EXAMPLE 42 | $Sr_2Al_2Si_{14}O_2N_{20.67}$:Ce | 0.030 | 7.00 | 460 | 6.2 | 6.3 | 566.3 | 0.3924 | 0.4622 |

4/3 b−2/3 o, wherein a=2.0, b=9.0, o=2.0), the molar ratio of Al, Si, O is fixed to 2, 9, 2, respectively, and the change of the emission intensity and luminance was measured when the molar ratio of Sr (here, a and Sr have the same meaning, i.e. a=Sr) was changed. Al=2.0, Si=9.0, and o=2.0 are fixed. Here, in the manufacture of the measurement sample, the phosphor sample was manufactured in the same way as the example 1, excepting that the mixing ratio was adjusted by adding $Al_2O_3$(3N) raw material to always obtain the value of O as O=2.0 in addition to $SrCO_3$(3N), AlN(3N), $Si_3N_4$(3N), and $CeO_2$(3N) explained in the example 1, and the emission intensity and luminance of the phosphor thus manufactured were measured. Wherein, the molar ratio of Sr thus adjusted was set to be Sr=0.50 (example 43), Sr=1.00 (example 44), Sr=1.50 (example 45), Sr=2.00 (example 46), Sr=2.50 (example 47), Sr=3.0 (example 48), Sr=4.0 (example 49), and Sr=6.0 (example 50).

(0121)

Figure 10:
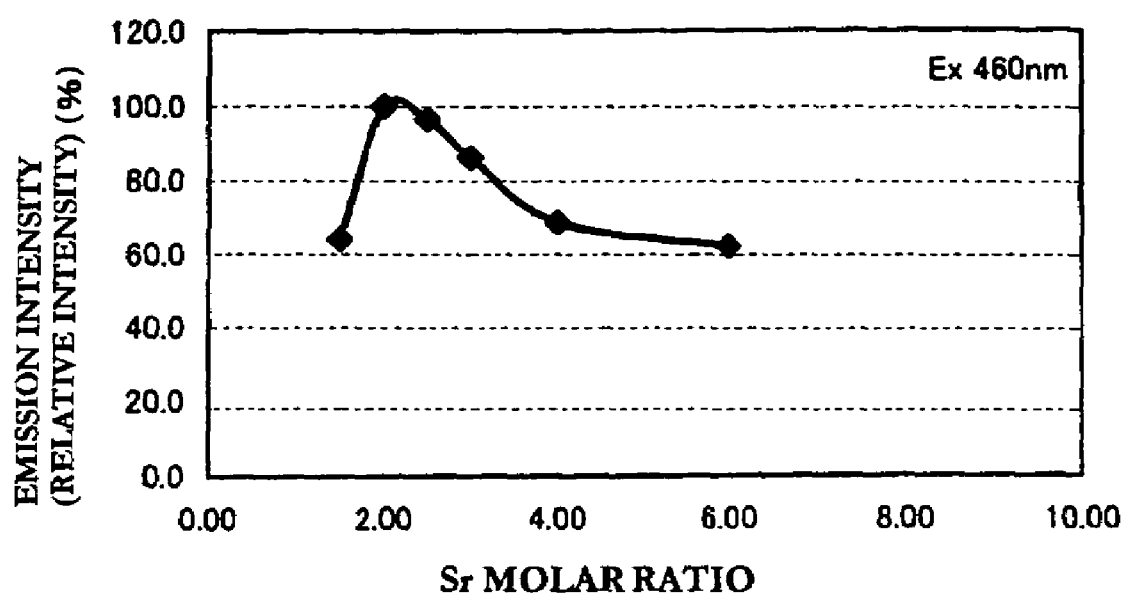
FIG. 10 is a graph showing the relation between Se molar ratio and the emission intensity in the phosphors of the examples 43 to 50.

The measurement result will be explained with reference to table 7 and FIG. 10. Here, FIG. 10 is a graph showing the relative intensity of the emission intensity of the phosphor sample taken on the ordinate axis, and the value of Sr molar ratio taken on the abscissa axis. With regards to the emission intensity and luminance, the value of the emission intensity in the peak wavelength of Sr=2.00 (example 46) was defined as 100%. The value of the Sr molar ratio is adjusted to 0.50 to 6.00, and the result is shown. The light with the wavelength of 460 nm was used as the excitation light.

(0123)

EXAMPLE 51 TO EXAMPLE 60

Change of Oxygen Concentration

In the example 51 to example 60, with regards to the phosphor expressed by the composition formula $Sr_2Al_2Si_9O_0N_n$:Ce(Ce/(Sr+Ce)=0.030, n=2/3 m+a+4/3 b−2/3 o, m=2.0, a=2.0, b=9.0), the molar ratio of Sr, Al, Si is fixed to 2, 2, 9, respectively, and the change of the emission intensity and luminance was measured when the o/m ratio (oxygen concentration) was changed. Here, in the manufacture of the measurement sample, the phosphor sample was manufactured in the same way as the example 1, excepting that the oxygen concentration was changed by mixing each raw material of $Sr_3N_2$(2N), $SrCO_3$(3N), AlN(3N), $Al_2O_3$ (3N), $Si_3N_4$(3N), $SiO_2$(3N), and $CeO_2$(3N) with a predetermined molar ratio, and the emission intensity and luminance were measured.

(0124)

As for the example in which the adjusted o/m ratio is o/m=0.0 (example 51), o/m=0.2 (example 52), and o/m=0.50 (example 53), $Sr_3N_2$, $Al_2O_3$, AlN, $Si_3N_4$ are used as raw materials, and as for the example in which the adjusted o/m ratio is o/m=1.00 (example 54), o/m=1.25 (example55), o/m=1.5 (example 56), o/m=2.0 (example57), and o/m=3.0 (example58), $SrCO_3$, $Al_2O_3$, AlN, $SiO_2$, and $Si_3N_4$ are used as the raw materials, and as for the example in which the

TABLE 7

| | COMPOSITION FORMULA | Ce/(Sr + Ce) | Sr MOLAR RATIO | EXCITATION WAVELENGTH (nm) | EMISSION INTENSITY (%) | LUMI-NANCE (%) | PEAK WAVE-LENGTH (nm) | CHROMA-TICITY x | y |
|---|---|---|---|---|---|---|---|---|---|
| EXAMPLE 43 | $Sr_{0.50}Al_2Si_9O_2N_{13.00}$:Ce | 0.030 | 0.50 | 460 | INCAPABLE MEASUREMENT | | | | |
| EXAMPLE 44 | $Sr_{1.00}Al_2Si_9O_2N_{13.33}$:Ce | 0.030 | 1.00 | 460 | INCAPABLE MEASUREMENT | | | | |
| EXAMPLE 45 | $Sr_{1.50}Al_2Si_9O_2N_{13.67}$:Ce | 0.030 | 1.50 | 460 | 64.1 | 63.7 | 559.1 | 0.4107 | 0.5377 |
| EXAMPLE 46 | $Sr_{2.00}Al_2Si_9O_2N_{14.00}$:Ce | 0.030 | 2.00 | 460 | 100.0 | 100.0 | 559.7 | 0.4099 | 0.5415 |
| EXAMPLE 47 | $Sr_{2.50}Al_2Si_9O_2N_{14.33}$:Ce | 0.030 | 2.50 | 460 | 96.5 | 98.7 | 561.6 | 0.4069 | 0.5358 |
| EXAMPLE 48 | $Sr_{3.00}Al_2Si_9O_2N_{14.67}$:Ce | 0.030 | 3.00 | 460 | 85.9 | 89.6 | 561.6 | 0.4005 | 0.5357 |
| EXAMPLE 49 | $Sr_{4.00}Al_2Si_9O_2N_{15.33}$:Ce | 0.030 | 4.00 | 460 | 68.5 | 72.6 | 561.6 | 0.3981 | 0.5315 |
| EXAMPLE 50 | $Sr_{6.00}Al_2Si_9O_2N_{16.67}$:Ce | 0.030 | 6.00 | 460 | 61.8 | 64.1 | 565.6 | 0.4250 | 0.5203 |

(0122)

As being clarified from the result of FIG. 10, with smaller molar ratio of 0.50 (example43) and 1.00 (example 44), the light emission was not obtained when the phosphor sample was irradiated with the light with the wavelength of 460 nm and 405 nm. Further, as an easy evaluation, when the phosphor sample was irradiated with the light of an ultraviolet lamp with the wavelength of 360 nm, blue emission color could be visually confirmed. This is because with smaller Sr molar ratio of 0.50 and 1.00, the ratio of Sr to occupy the mixed powder of $SrCO_3$ is small, and the $SrCO_3$ does not excellently act as flux, not to generate the phase emitting yellow light but to generate other phase, thus exhibiting blue light emission under the excitation light of short wavelength. In addition, when the Sr molar ratio is gradually increased from 1.00, the emission intensity and luminance are increased along with the increase of the Sr molar ratio, with a peak at Sr=2.00 (example 46). However, the emission intensity is decreased when the value of Sr becomes beyond 2.00.

adjusted o/m ratio is o/m=5.0 (example 59), o/m=10.0 (example 60), $Sr_3N_2$, $Al_2O_3$, $SiO_2$, and $Si_3N_4$ are used as the raw materials.

(0125)

Figure 11:
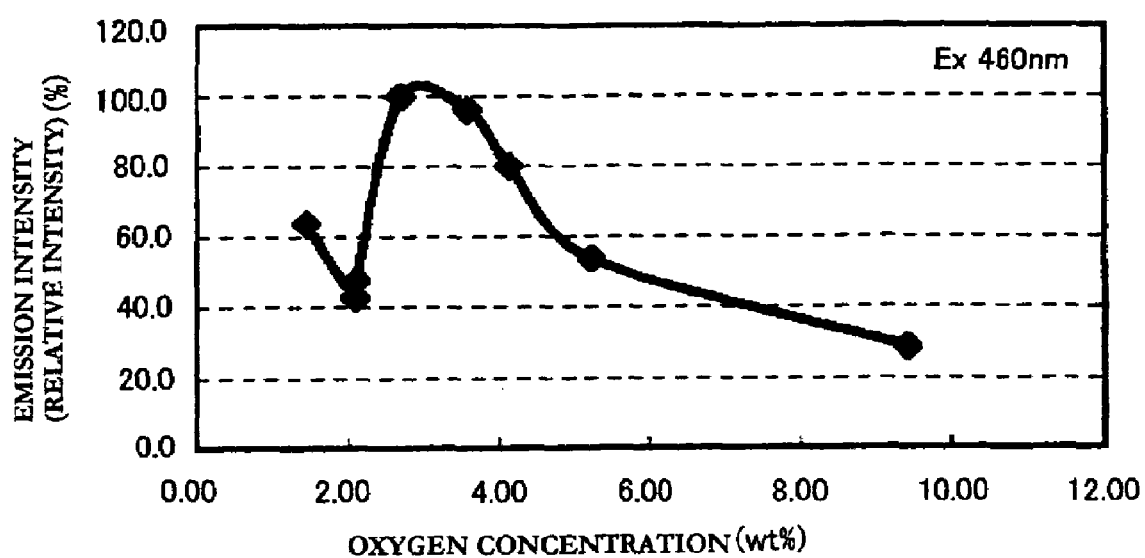
FIG. 11 is a graph showing the relation between oxygen concentration and the emission intensity in the phosphors of the examples 51 to 60.

The measurement result will be explained with reference to table 8 and FIG. 11. Here, FIG. 11 is a graph showing the relative intensity of the emission intensity of the phosphor sample taken on the ordinate axis, and the value of the oxygen concentration (weight %) in the phosphor taken on the abscissa axis. In the emission intensity and luminance, the value of the emission intensity in the peak wavelength of o/m=1.0 (example 54) was defined as 100%. The light with the wavelength of 460 nm was used as the excitation light.

As being clarified from the result of table 8 and FIG. 11, the emission intensity and luminance of each phosphor are decreased in both cases of increasing or decreasing the oxygen concentration with a peak at 3.5 wt %. Further, when the oxygen concentration becomes not less than 10.0 wt %, each phosphor is melted and vitrified.

TABLE 8

| | COMPOSITION FORMULA | Ce/ (Sr + Ce) | O MOLAR RATIO | O (wt %) | N (wt %) | EXCITATION WAVELENGTH (nm) | EMISSION INTENSITY (%) | LUMINANCE (%) | PEAK WAVELENGTH (nm) | CHROMATICITY x | y |
|---|---|---|---|---|---|---|---|---|---|---|---|
| EXAMPLE 51 | $Sr_2Al_2Si_9O_{0.00}N_{15.33}$:Ce | 0.030 | 0.00 | 1.44 | 29.1 | 460 | 63.7 | 60.5 | 561.7 | 0.4236 | 0.5325 |
| EXAMPLE 52 | $Sr_2Al_2Si_9O_{0.40}N_{15.07}$:Ce | 0.030 | 0.20 | 2.08 | 29.6 | 460 | 42.6 | 41.0 | 561.2 | 0.4128 | 0.5317 |
| EXAMPLE 53 | $Sr_2Al_2Si_9O_{1.00}N_{14.67}$:Ce | 0.030 | 0.50 | 2.10 | 28.1 | 460 | 47.6 | 45.8 | 561.2 | 0.4111 | 0.5297 |
| EXAMPLE 54 | $Sr_2Al_2Si_9O_{2.00}N_{14.00}$:Ce | 0.030 | 1.00 | 2.68 | 27.2 | 460 | 100.0 | 100.0 | 559.7 | 0.4096 | 0.5410 |
| EXAMPLE 55 | $Sr_2Al_2Si_9O_{2.50}N_{13.67}$:Ce | 0.030 | 1.25 | 3.56 | 26.9 | 460 | 96.3 | 96.4 | 558.1 | 0.4039 | 0.5421 |
| EXAMPLE 56 | $Sr_2Al_2Si_9O_{3.00}N_{13.33}$:Ce | 0.030 | 1.50 | 4.12 | 26.4 | 460 | 80.2 | 80.5 | 558.1 | 0.4037 | 0.5400 |
| EXAMPLE 57 | $Sr_2Al_2Si_9O_{4.00}N_{12.57}$:Ce | 0.030 | 2.00 | 5.22 | 25.1 | 460 | 53.8 | 53.9 | 559.1 | 0.3939 | 0.5323 |
| EXAMPLE 58 | $Sr_2Al_2Si_9O_{6.00}N_{11.33}$:Ce | 0.030 | 3.00 | 9.42 | 21.7 | 460 | 28.2 | 25.4 | 554.6 | 0.3670 | 0.5051 |
| EXAMPLE 59 | $Sr_2Al_2Si_9O_{10.0}N_{8.67}$:Ce | 0.030 | 5.00 | | | 460 | INCAPABLE MEASUREMENT (VITRIFICATION) | | | | |
| EXAMPLE 60 | $Sr_2Al_2Si_9O_{20.0}N_{2.00}$:Ce | 0.030 | 10.00 | | | 460 | INCAPABLE MEASUREMENT (VITRIFICATION) | | | | |

(0126)

This is because when the oxygen concentration becomes not less than 4.0 wt %, the matrix structure of the phosphor begins to gradually vitrified, and completely vitrified at 10.0 wt % or more, thereby collapsing the crystal structure and deteriorating the crystallinity. Actually, when the X-ray diffraction measurement was performed for the sample having different oxygen concentration, it was confirmed that the peak intensity of diffraction was significantly lowered along with the increase of the oxygen concentration, and the half value width of the peak was gradually enlarged, and each phosphor was vitrified along with the increase of the oxygen concentration. When the matrix structure of the phosphor was vitrified, the structure around Ce ion as the center of light emission becomes irregular, to cause a variance in the space between each center of light emission, or efficient light emission is obtained at some place but no light emission is obtained at another place because an energy from the excitation light absorbed by the matrix body can not be efficiently transferred to the center of the light emission, and therefore the emission intensity as an entire body of the phosphor is deteriorated. Accordingly, preferably 10 wt % or less (in the range of 0.0<o/m<4.0 when defined in terms of molar ratio) of the oxygen concentration in the phosphor is preferable. When the emission characteristic and powder characteristics after firing are taken into consideration, 0.5 wt % or more and 6.0 wt % or less (in the range of 0.0<o/m≦3.0 when defined in terms of molar ratio) is preferable. More preferably, when the oxygen concentration is in the range from 2.0 wt % to 5.0 wt % (in the range of 0.5<o/m≦2.0), it appears that sufficient emission intensity and luminance can be obtained.

EXAMPLE 61

Temperature Characteristic

In the example 61, the emission intensity at 25° C. to 300° C. was measured for the samples from example 37 to example 41.

First, measurement of the emission intensity $P_T$ at temperature of T° C. of the phosphor and the change of the emission intensity will be explained. The aforementioned emission intensity $P_{25}$ is obtained by measuring the spectrum of the light emitted by the emission body when the phosphor which is placed in an environment of 25° C. is irradiated with the excitation light of a predetermined wavelength as will be described later. The peak having the maximum peak in the measured spectrum is defined as the maximum peak, and the value of the relative intensity of the peak is defined as $P_{25}$.

Next, the temperature is increased from 25° C., the phosphor is placed in an environment of T° C., and the spectrum of the light emitted from the phosphor was measured under the same excitation light as that irradiated on measurement at 25° C. In the measured spectrum, the relative intensity of the peak corresponding to the peak defined as the maximum peak on measuring at 25° C. is obtained, and the value thus obtained is defined as $P_T$. From the values $P_{25}$ and $P_T$ thus obtained, the rate of change:$(P_{25}-P_T)/P_{25}\times100$ (%) is calculated.

Figure 12:
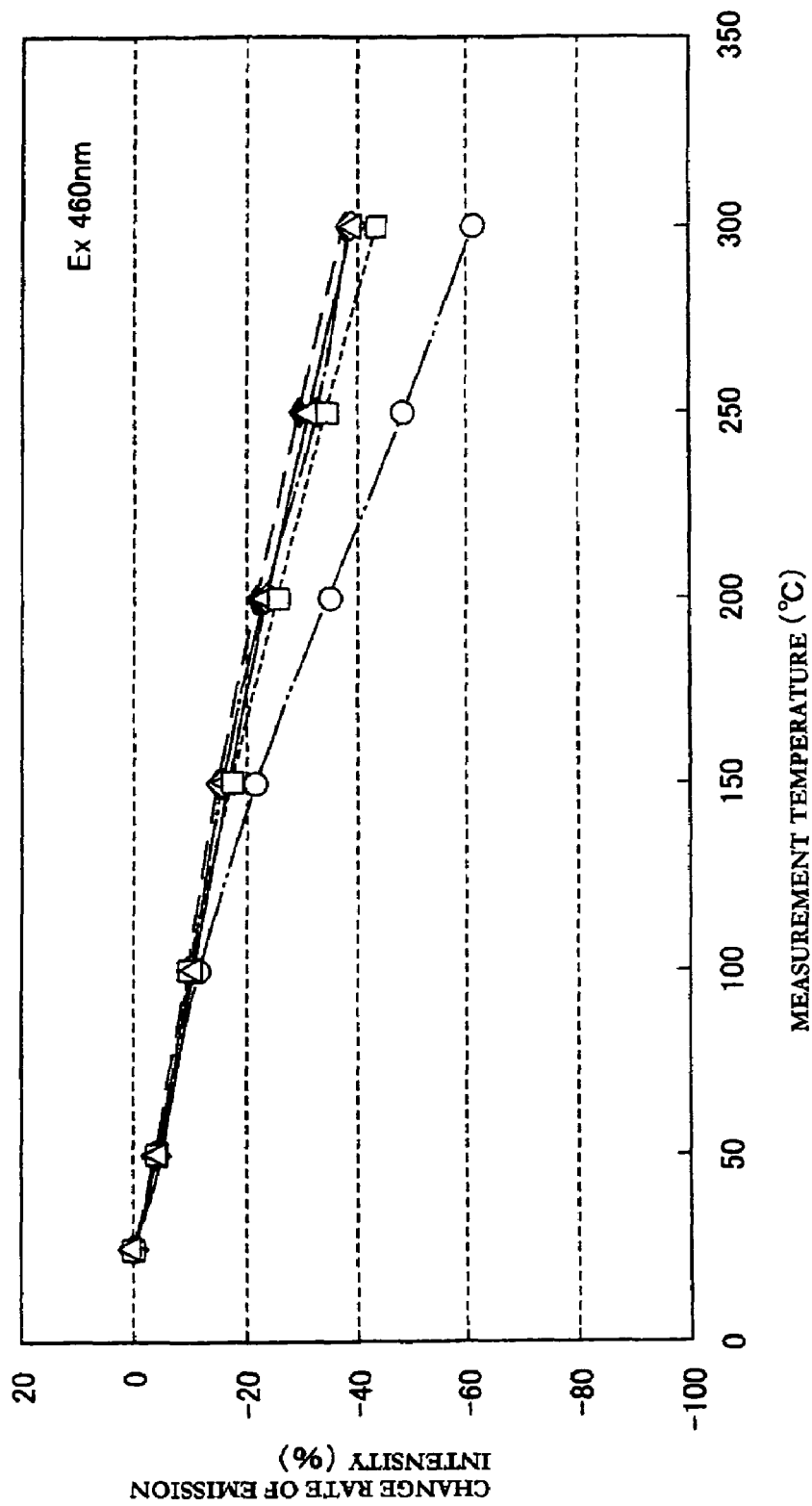
FIG. 12 is a graph showing a rate of change of the emission intensity to temperature in each phosphor of the example 61 (examples 37 to 41)

Any value may be appropriate as the wavelength of the excitation light to irradiate, however in this embodiment, the light is used as the excitation light with the wavelength of 460 nm, which is the emission wavelength of blue LED mainly used as an light emitting element for one chip type white LED illumination, and the result thus obtained is shown in table 9 and FIG. 12. FIG. 12 is a graph showing a measurement temperature T° C. taken on the abscissa axis, and the rate of change of the emission intensity taken on the ordinate axis. The rate of change of the emission intensity of the ordinate axis of the graph according to FIG. 12 is expressed by defining the emission intensity of each sample $P_{25}$ as a reference value 0.0 on the ordinate axis, and setting the measurement temperature at 25° C., 50° C., 100° C., 150° C., 200° C., 250° C., and 300° C. on the abscissa axis.

(0129)

As being clarified from the result of table 9 and FIG. 12, each sample has a tendency of decreasing the emission intensity as the measurement temperature becomes higher, but absolute values of $(P_{25}-P_{200})/P_{25}\times100$ at 200° C. are all 35% or less, and it was found that the phosphor was excellent in temperature characteristics. Further, the absolute values of $(P_{25}-P_{200})/P_{25}\times100$ at 100° C. considered to be close to the temperature of using the actual LED are all 15% or less, and it is confirmed that each phosphor of the example 61 maintains high emission intensity even in a high temperature state.

As described above, in the phosphor of the example 61, the deterioration of the emission intensity and the luminance is small, even when the temperature of the phosphor is increased due to heat generation of a light emitting part. Accordingly, in the white LED illumination manufactured by using the phosphor, even when the temperature is increased by introducing a large current to the LED, high emission intensity and luminance can be maintained, and the light emission with small change of color tone can be obtained. This contributes to obtaining a suitable illumination device thereby.

TABLE 9

| EXAMPLE OF MANU-FACTURING SAMPLES | COMPOSITION FORMULA | Ce/ (Sr + Ce) | EXCITATION WAVE-LENGTH (nm) | EMISSION INTENSITY (%) (25° C.) | CHANGE-RATE OF EMISSION INTENSITY AT EACH MEASUREMENT TEMPERATURE (TEMPERATURE RISING PROCESS) | | | | | | |
|---|---|---|---|---|---|---|---|---|---|---|---|
| | | | | | 25° C. | 50° C. | 100° C. | 150° C. | 200° C. | 250° C. | 300° C. |
| EXAMPLE 37 | $Sr_3Al_3Si_{12}O_3N_{19}$:Ce | 0.030 | 460 | 94.7 | 0.0 | −4.1 | −11.7 | −21.7 | −34.6 | −48.5 | −61.3 |
| EXAMPLE 38 | $Sr_2Al_2Si_9O_2N_{14}$:Ce | 0.030 | 460 | 100.0 | 0.0 | −4.9 | −9.8 | −17.3 | −25.5 | −34.2 | −43.4 |
| EXAMPLE 39 | $Sr_3Al_3Si_{15}O_3N_{23}$:Ce | 0.030 | 460 | 96.3 | 0.0 | −3.6 | −9.5 | −14.9 | −21.8 | −29.4 | −37.3 |
| EXAMPLE 40 | $Sr_6Al_6Si_{33}O_6N_{50}$:Ce | 0.030 | 460 | 80.2 | 0.0 | −4.1 | −10.2 | −15.6 | −23.2 | −32.6 | −38.4 |
| EXAMPLE 41 | $SrAlSi_6ON_9$:Ce | 0.030 | 460 | 61.6 | 0.0 | −4.8 | −10.7 | −16.8 | −23.6 | −31.1 | −39.0 |

(Example 61 spans the rows above.)

EXAMPLE 62

X-Ray Diffraction Measurement by Powder Method

In an example 62, a powder X-ray diffraction measurement was performed for examples 37 to 41.

Figure 13:
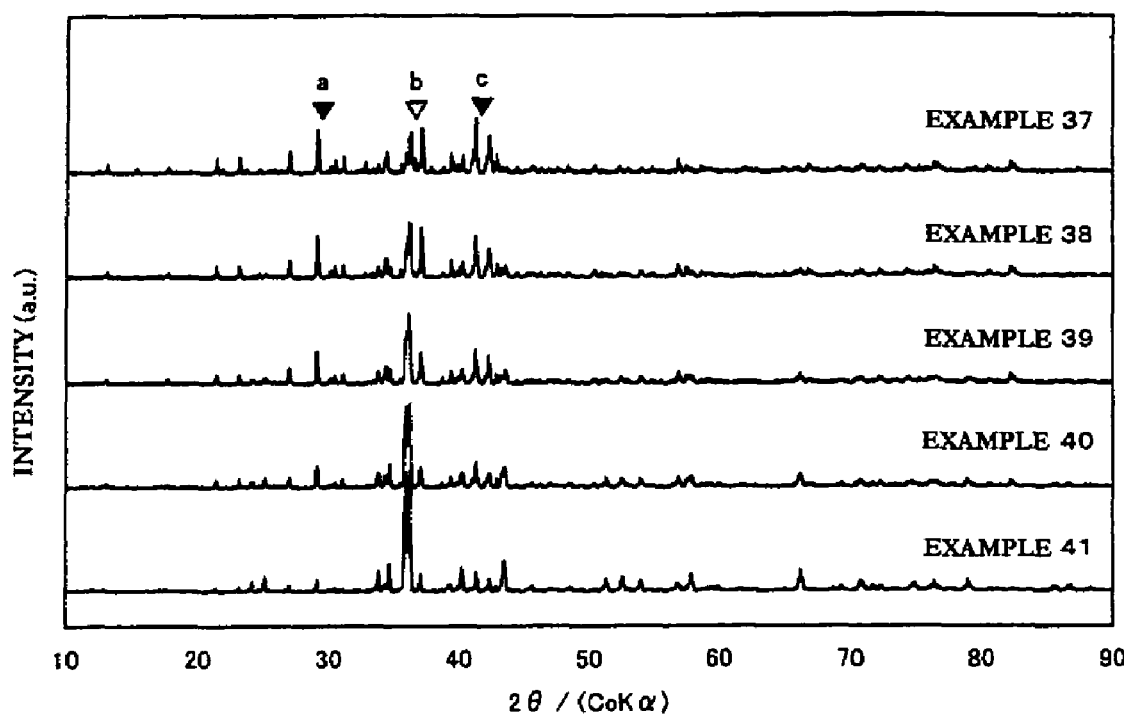
FIG. 13 is a graph showing a powder X-ray diffraction pattern by CoKα ray in each phosphor of the example 62 (examples 37 to 41).

A powder X-ray diffraction pattern shown by the phosphors of the examples 37 to 41 is shown in FIG. 13, and I(a/b), I(c/b), the emission intensity, and the aforementioned rate of change of the emission intensity $(P_{25}-P_{200})/P_{25} \times 100$ at 200° C. of each example are shown in table 10.

| X-ray bulb: | CoKα |
|---|---|
| Tube voltage: | 40 kV |
| Tube current: | 30 mA |
| Scan method: | 2θ/θ |
| Scan speed: | 0.3°/min |
| Sampling interval: | 0.01° |
| Start angle (2θ): | 10° |
| Stop angle (2θ): | 90° |

TABLE 10

| EXAMPLE OF MANU-FACTURING SAMPLES | COMPOSITION FORMULA | I (a/b) | I (c/b) | EMISSION INTENSITY (%) | LUMINANCE (%) | PEAK WAVELENGTH (nm) | CHROMATICITY x | CHROMATICITY y | CHANGE-RATE OF EMISSION INTENSITY (%) |
|---|---|---|---|---|---|---|---|---|---|
| EXAMPLE 37 | $Sr_3Al_3Si_{12}O_3N_{19}$:Ce | 1.05 | 1.331 | 94.7 | 96.2 | 559.0 | 0.4088 | 0.5432 | −34.6 |
| EXAMPLE 38 | $Sr_2Al_2Si_9O_2N_{14}$:Ce | 0.77 | 0.755 | 100.0 | 100 | 559.3 | 0.4156 | 0.5434 | −25.5 |
| EXAMPLE 39 | $Sr_3Al_3Si_{15}O_3N_{23}$:Ce | 0.46 | 0.491 | 96.3 | 95.7 | 559.2 | 0.4171 | 0.5427 | −21.8 |
| EXAMPLE 40 | $Sr_6Al_6Si_{33}O_6N_{50}$:Ce | 0.27 | 0.298 | 80.2 | 86.2 | 559.7 | 0.4187 | 0.5413 | −23.2 |
| EXAMPLE 41 | $SrAlSi_6ON_9$:Ce | 0.09 | 0.158 | 61.6 | 61.0 | 562.3 | 0.4237 | 0.5337 | −23.6 |

(EXAMPLE 62 spans the rows above.)

The example 37, the example 38, the example 39, the example 40, and the example 41 are the samples manufactured in the same way as the example 1, in which each raw material of $SrCO_3$, AlN, $Si_3N_4$, $CeO_2$, or $Al_2O_3$ is adjusted in accordance with a target mixing composition ratio, to obtain a composition formula of $Sr_3Al_3Si_{12}O_3N_{19}$:Ce, $Sr_2Al_2Si_9O_2N_{14}$:Ce, $Sr_3Al_3Si_{15}O_3N_{23}$:Ce, $Sr_6Al_6Si_{33}O_6N_{50}$:Ce, and $SrAlSi_6ON_9$:Ce, respectively. Wherein the Ce concentration as an activator are all Ce/(Sr+Ce)=0.030.

Here, the measurement method of the X-ray diffraction pattern of the phosphor by powder method will be explained.

The phosphor to be measured was pulverized after firing up to a prescribed (preferably 1.0 μm to 20.0 μm) average particle size by using pulverizing means such as a mortar and a ball mill, and a holder of titanium was filled with the phosphor thus pulverized so that its surface becomes flat, and the X-ray diffraction pattern of the phosphor was measured by using an XRD device by RIGAKU DENKI INCO., (RINT 2000). Measurement conditions are as follows.

Measuring instrument: "RINT 2000" by RIGAKU DENKI INC.

The deviation of the Bragg angle (2θ) is possibly caused by a sample surface to be irradiated with X-ray is not flat, measurement conditions of X-ray, and particularly the difference in scan speed. Therefore, a slight deviation would be allowable in the range where a characteristic diffraction peak is observed. In the example 62, in order to suppress the deviation as much as possible, Si is mixed in the phosphor sample, with the scan speed set at 0.3°/min, and the deviation of Si peak is corrected after X-ray measurement, to thereby obtain the Bragg angle (2θ) and an inter-lattice distance (d).

Next, a main peak in the X-ray diffraction pattern of a product phase included in each phosphor in the example 62 will be explained.

As being clarified from FIG. 13, the product phase included in each phosphor in the example 62 has characteristic peaks in the Bragg angle (2θ) range of 12.5 to 13.5°, 21.0 to 22.0°, 22.5 to 23.5°, 26.5 to 27.5°, 28.5 to 29.5°, 34.5 to 35.5°, 35.5 to 36.5°, 36.5 to 37.5°, 41.0 to 42.0°, 42.0 to 43.00, 56.5 to 57.5°, and 66.0 to 67.0°, wherein the peaks in the range of 28.5° to 29.5°, 35.5° to 36.5°, and 41.0° to 42.0° have high intensity and are particularly characteristic. Therefore, when such peaks are defined as a, b, c and a peak intensity ratio of a, c to b is expressed by I(a/b), I(c/b), the peak intensity is changed in the range of 0.02<I(a/b), I(c/b) <1.5, by changing the mixing composition of the phosphor within a composition range.

Particularly, from the viewpoint of the emission intensity, the emission intensity is excellent in the range of 0.20<I(a/b), I(c/b)<0.80, and the temperature characteristic is excellent in the range of I(a/b)<0.6, and I(c/b)<0.6.

Although a detailed relation between the aforementioned characteristics of the X-ray diffraction pattern and an excellent emission characteristic and a favorable temperature characteristic shown by each phosphor in the example 62 has not been clarified yet, possibility is considered as follows.

A diffraction pattern is observed, which is close to the diffraction pattern based on the composition formula of the example 41 ($SrAlSi_6ON_9$), when a larger amount of Si to be added is contained in the mixing composition.

When the amount of Si to be added in the mixing composition is reduced (examples 37 to 40), diffracted rays observed in the peaks of a and c are strongly shown. From this fact, a $SrAlSi_6ON_9$ structure is collapsed due to reduction of the amount of Si to be added, resulting in showing a different crystal structure, and when the structure is shown satisfying the range of particularly 0.4<I(a/b), I(c/b)<0.8, the emission intensity is increased. This reveals that the crystal structure with excellent emission efficiency is shown by change of atomic distance of oxygen and nitrogen surrounding the sites of Sr and Ce in the crystal structure.

However, with regards to the temperature characteristic, when a larger amount of Si to be added is contained in the mixing composition, a deterioration rate of the emission intensity at 200° C. compared to the emission intensity at 25° C. is reduced, and a stable substance to the temperature change can be obtained. This is because the number of diffracted rays observed is reduced when the structure of the phosphor becomes closer to the structure of $SrAlSi_6ON_9$, then the crystal structure inside shows a relatively simple structure, as a result, unstableness of the crystal structure is reduced, and a stable structure to the temperature change is exhibited. Accordingly, from the viewpoint of the temperature characteristic, it is preferable to take the crystal structure in the range of I(a/b)<0.60, and I(c/b)<0.60.

As described above, in order to obtain both of characteristics of the emission intensity and the temperature characteristic, it is preferable to take the crystal structure in the range of 0.40<I(a/b), I(c/b)<0.60.

EXAMPLE 63

Figure 14:
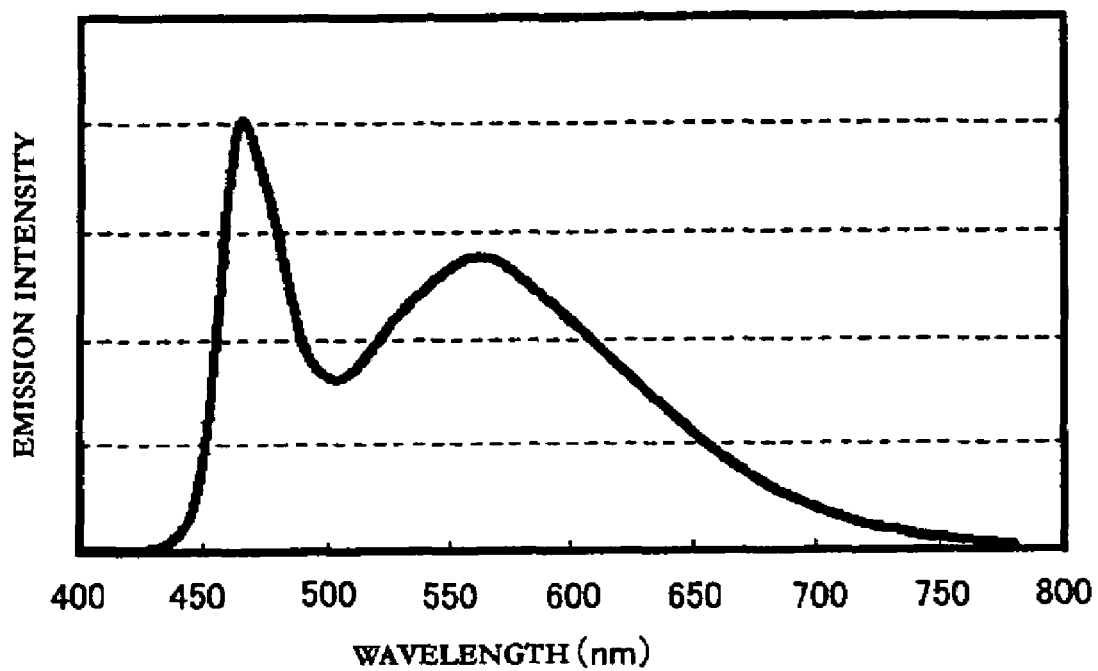
FIG. 14 is a graph showing the emission spectrum of a white LED lamp having the phosphor of the example 1.
Figure 15:
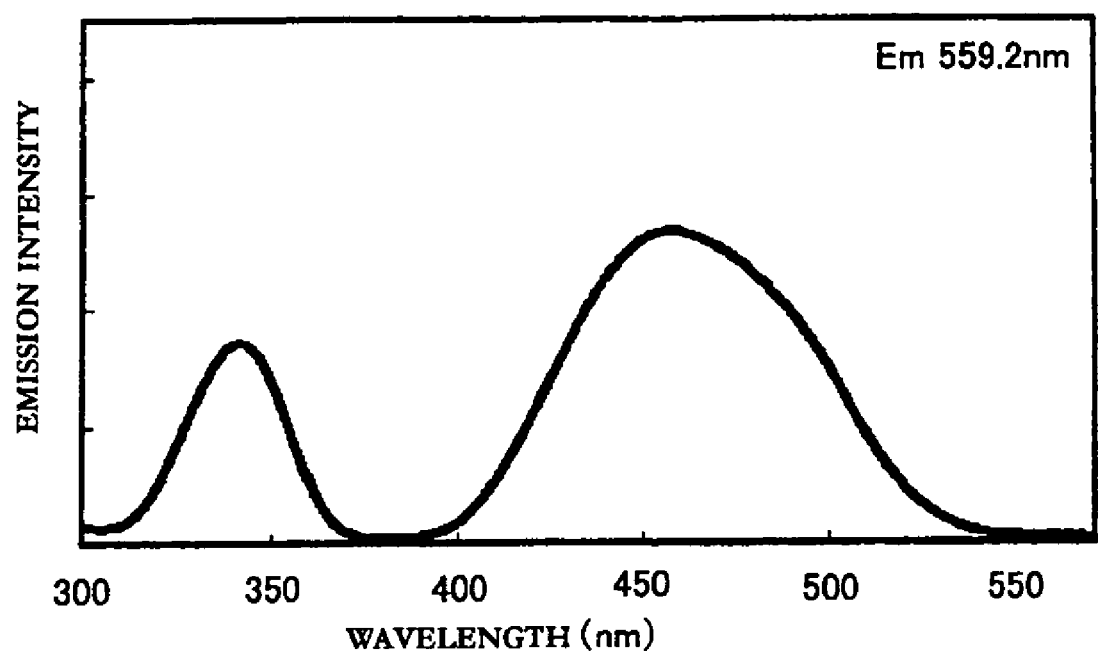
FIG. 15 is a graph showing the emission spectrum of the conventional yellow phosphor YAG :Ce.

A mixture of the phosphor sample obtained in the example 1 (composition formula $Sr_2Al_2Si_9O_2N_{14}$:Ce (wherein Ce/(Sr+Ce)=0.030)) and resin was set on the light emitting element, with a blue light emitting element (LED, with emission wavelength of 467 nm) having a nitride semiconductor set as the light emitting part. The mixing ratio of the phosphor and the resin was adjusted so as to obtain a daylight color corresponding to color temperature 6000° K., and a white color LED lamp was manufactured by combining the LED and the light emitting part by a publicly-known method. The emission spectrum obtained by energizing the light emitting element of the white color LED lamp thus obtained with current of 20 mA is shown in FIG. 14. The phosphor in this case emits light under an excitation of blue light emitted from the light emitting part, and the light thus emitted and the blue light are mixed to emit white light, thus obtaining the white color LED lamp. Specifically, as shown in FIG. 14, the white color LED lamp (light emitting device) having the emission spectrum with a broad peak and having a high color rendering property in the wavelength range from 450 nm to 700 nm could be obtained. The color temperature of the light emission or the chromaticity were measured, to obtain the color temperature of 6078° K., and x=0.317, y=0.374, respectively. The average color rendering index (Ra) of the white color LED lamp was 73. Further, by properly changing the blending amount of the phosphor and the resin, the emission color of different color temperature could also be obtained.

What is claimed is:

1. A phosphor, which is given as a general composition formula expressed by MmAaBbOoNn:Z, (where element M is one or more kinds of elements having bivalent valency, element A is one or more kinds of elements having tervalent valency, element B is one or more kinds of elements having tetravalent valency, O is oxygen, N is nitrogen, and element Z is Ce acting as an activator.), satisfying 4.0<(a+b)/m<7.0, 0.8≦a/m≦1.2, b/a>2.5, n>o, 4.0≦b/m≦6.0, 0<o/m≦3.0, n=2/3m+a+4/3b−2/3o, wherein when the phosphor is irradiated with one or more kind of monochromatic light or continuous light having a wavelength range from 350 nm to 500 nm as an excitation light, a peak wavelength in an emission spectrum is in the range from 500 to 600 nm.

2. The phosphor according to claim 1, wherein the element M is one or more kinds of elements selected from the group consisting of Mg, Ca, Sr, Ba, Zn and rare earth elements having bivalent valency, the element A is one or more kinds of elements selected from the group consisting of Al, Ga, In, Tl, Y, Sc, P, As, Sb, and Bi, the element B is one or more kinds of elements selected from the group consisting of Si, Ge, Sn, Ti, Hf, Mo, W, Cr, Pb, Zr.

3. The phosphor according to claim 1, wherein the element M is one or more kinds of elements selected from the group consisting of Mg, Ca, Sr, Ba, Zn, the element A is one or more kinds of elements selected from the group consisting of Al, Ga, In, the element B is Si or Ge or Si and Ge.

4. The phosphor according to claim 1, wherein the element M is Sr, the element A is Al, the element B is Si.

5. The phosphor according to claim 1, wherein when the general formula is expressed by MmAaBbOoNn:Zz, a value of z/(m+z), which is a molar ratio of the element M to the element Z, is 0.0001 or more and 0.5 or less.

6. The phosphor according to claim 1, which is given as formulas expressed by: $Sr_6Al_6Si_{18}O_3N_{32}$:Ce, $SrAlSi_3ON_5$:Ce, $Sr_3Al_3Si_9O_6N_{13}$:Ce, $Sr_6Al_6Si_{24}O_3N_{40}$:Ce, $Sr_3Al_3Si_{12}O_3N_{19}$:Ce, $Sr_3Al_3Si_{12}O_6N_{17}$:Ce, $Sr_6Al_6Si_{27}O_3N_{44}$:Ce, $Sr_2Al_2Si_9O_2N_{14}$:Ce, $Sr_6Al_6Si_{27}O_{12}N_{38}$:Ce, $Sr_2Al_2Si_{10}ON_{16}$:Ce, $Sr_3Al_3Si_{15}O_3N_{23}$:Ce, $SrAlSi_5O_2N_7$:Ce, $Sr_6Al_6Si_{36}O_3N_{56}$:Ce, $SrAlSi_6ON_9$:Ce,$Sr_3Al_3Si_{18}O_6N_{25}$:Ce.

7. The phosphor according to claim 1, containing Sr of 20.0 to 27.0 wt %, Al of 5.0 to 9.0 wt %, Si of 30.0 to 39.0 wt %, O of 0.5 to 6.0 wt %, N of 26.0 to 32.0 wt %, and Ce of beyond 0 to 3.5 wt %, wherein x of chromaticity (x, y) of the emission spectrum is in the range from 0.3500 to 0.4500, and y of the chromaticity (x, y) is in the range from 0.5000 to 0.6000.

8. The phosphor according to claim 1, wherein in an X-ray powder diffraction pattern by CoKα ray, when maximum peaks are defined as a, b, and c, respectively, with Bragg angle (2θ) in a range from 28.5° to 29.5°, 35.5°to 36.5°, and 41.0° to 42.0°, and a peak intensity ratio of a to b is defined as I(a/b), and a peak intensity ratio of c to b is defined as I(c/b), a relation of a, b, c is given satisfying 0.20<I(a/b),I(c/b)<0.80.

9. The phosphor according to claim 1, wherein when a value of relative intensity of a maximum peak in the emission spectrum is defined as $P_{25}$ when the phosphor is irradiated with a specified monochromatic light in the wavelength range from 350 nm to 550 nm as the excitation light at 25° C., and a value of relative intensity of a maximum peak is defined as $P_{200}$ when the phosphor is irradiated with the specified monochromatic light as the excitation light at 200° C., a relation of $P_{25}$ and $P_{200}$ is given satisfying $(P_{25}-P_{200})/P_{25}\times 100 \leq 35$.

10. The phosphor according to claim 1, wherein the phosphor is a powdery form.

11. The phosphor according to claim 10, containing a primary particle with particle size of 20μm or less and aggregates in which the primary particle agglutinates, wherein an average particle size (D50) of the powdery phosphor containing the primary particle and the aggregates is 1.0 μm or more and 20.0 μm or less.

12. A method of manufacturing the phosphor according to claim 1, wherein by using a crucible composed of nitride as a firing crucible, raw materials are fired at temperature of 1400° C. or more and 2000° C. or less in an atmosphere containing one or more kind of gas selected from nitrogen gas, rare gas, and ammonia gas.

13. The method of manufacturing the phosphor according to claim 12, wherein the raw materials are fired by setting pressure inside furnace at 0.5MPa or less.

14. ) The method of manufacturing the phosphor according to claim 12, wherein the crucible composed of nitride is a BN crucible.

15. The method of manufacturing the phosphor according to claim 12, wherein the raw materials are fired, with 0.1 ml/min or more gas containing one or more kind of gas selected from the nitrogen gas, rare gas, and the ammonia gas flowing inside the furnace.

16. The method of manufacturing the phosphor according to claim 12, wherein the raw materials are fired in a powdery state.

17. An emission device, having the phosphor according to claim 11, and an emission part emitting light of a first wavelength, wherein the light with the wavelength different from the first wavelength is emitted from the phosphor, with a part of or the whole part of the light of the first wavelength as an excitation light.

18. The emission device according to claim 17, wherein the first wavelength is in a range from 350 nm to 550 nm.

19. The emission device according to claim 17, wherein the emission part emitting the first wavelength is an LED.

20. A phosphor, which is given as a general composition formula expressed by MmAaBbOoNn:Z, (where element M is one or more kinds of elements having bivalent valency, element A is one or more kinds of elements having tervalent valency, element B is one or more kinds of elements having tetravalent valency, O is oxygen, N is nitrogen, and element Z is Eu acting as an activator.), satisfying $4.0<(a+b)/m<7.0, 0.08 \leq a/m \leq 1.2, b/a>2.5, n>o, 4.0 \leq b/m \leq 6.0, 0<o/m \leq 3.0, n=2/3m+a+4/3b-2/3o$, wherein when the phosphor is irradiated with one or more kind of monochromatic light or continuous light having a wavelength range from 350 nm to 500 nm as an excitation light, a peak wavelength of an emission spectrum is in the range from 550 to 650 nm.

21. The phosphor according to claim 20, wherein the element M is one or more kinds of elements selected from the group consisting of Mg, Ca, Sr, Ba, Zn and rare earth elements having bivalent valency, the element A is one or more kinds of elements selected from the group consisting of Al, Ga, In, Tl, Y, Sc, P, As, Sb, and Bi, the element B is one or more kinds of elements selected from the group consisting of Si, Ge, Sn, Ti, Hf, Mo, W, Cr, Pb, Zr.

22. The phosphor according to claim 20, wherein the element M is one or more kinds of elements selected from the group consisting of Mg, Ca, Sr, Ba, Zn, the element A is one or more kinds of elements selected from the group consisting of Al, Ga, In, the element B is Si or Ge or Si and Ge.

23. The phosphor according to claim 20, wherein the element M is Sr, the element A is Al, the element B is Si.

24. The phosphor according to claim 20, wherein when the general formula is expressed by MmAaBbOoNn:Zz, a value of z/(m+z), which is a molar ratio of the element M to the element Z, is 0.0001 or more and 0.5 or less.

25. The phosphor according to claim 20, which is given as formulas expressed by: $Sr_6Al_6Si_{18}O_3N_{32}$:Eu, $SrAlSi_3ON_5$:Eu, $Sr_3Al_3Si_9O_6N_{13}$:Eu, $Sr_6Al_6Si_{24}O_3N_{40}$:Eu, $Sr_3Al_3Si_{12}O_3N_{19}$:Eu, $Sr_3Al_3Si_{12}O_6N_{17}$:Eu, $Sr_6Al_6Si_{27}O_3N_{44}$:Eu, $Sr_2Al_2Si_9O_2N_{14}$:Eu, $Sr_6Al_6Si_{27}O_{12}N_{38}$:Eu, $Sr_2Al_2Si_{10}ON_{16}$:Eu, $Sr_3Al_3Si_{15}O_3N_{23}$:Eu, $SrAlSi_5O_2N_7$:Eu, $Sr_6Al_6Si_{36}O_3N_{56}$:Eu, $SrAlSi_6ON_9$:Eu, $Sr_3Al_3Si_{18}O_6N_{25}$:Eu.

26. The phosphor according to claim 20, wherein in an X-ray powder diffraction pattern by CoKα ray, when maximum peaks are defined as a, b, and c, respectively, with Bragg angle (2θ) in a range from 28.5° to 29.5°, 35.5° to 36.5°, and 41.0° to 42.0°, and a peak intensity ratio of a to b is defined as I(a|b), and a peak intensity ratio of c to b is defined as I(c/b), a relation of a, b, c is given satisfying $0.20<I(a/b), I(c/b)<0.80$.

27. The phosphor according to claim 20, wherein when a value of relative intensity of a maximum peak in the emission spectrum is defined as $P_{25}$ when the phosphor is irradiated with a specified monochromatic light in the wavelength range from 350 nm to 550 nm as the excitation light at 25° C., and a value of relative intensity of a maximum peak is defined as $P_{200}$ when the phosphor is irradiated with the specified monochromatic light as the excitation light at 200° C., a relation of $P_{25}$ and $P_{200}$ is given satisfying $(P_{25}-P_{200})/P_{25}\times 100 \leq 35$.

28. The phosphor according to claim 20, containing Sr of 20.0 to 27.0 wt %, Al of 5.0 to 9.0 wt %, Si of 30.0 to 39.0 wt %, O of 0.5 to 6.0 wt %, N of 26.0 to 32.0 wt %, and Eu of beyond 0 to 3.5 wt %, wherein x of chromaticity of the emission spectrum (x, y) is in the range from 0.4500 to 0.6000, and y of the chromaticity of the emission spectrum (x, y) is in the range from 0.3500 to 0.5000.

29. The phosphor according to claim 28, wherein when the phosphor is irradiated with the monochromatic light having the wavelength range from 350 nm to 550 nm as the excitation light, a relation of $P_H$ and $P_L$ is given satisfying $(P_H-P_L)/P_H \leq 0.20$, when a peak intensity of a maximum peak in a spectrum of light emission that occurs by absorbing the excitation light that makes the peak intensity highest is defined as $P_H$, and a peak intensity of a maximum peak in a spectrum of light emission that occurs by absorbing the excitation light that makes the peak intensity smallest is defined as $P_L$.

30. The phosphor according to claim 20, wherein the phosphor is a powdery form.

31. A method of manufacturing the phosphor according to claim 20 wherein by using a crucible composed of nitride as a firing crucible, raw materials are fired at temperature of 1400° C. or more and 2000° C. or less in an atmosphere containing one or more kind of gas selected from nitrogen gas, rare gas, and ammonia gas.

* * * * *